US011411090B2

(12) United States Patent
Liaw

(10) Patent No.: US 11,411,090 B2
(45) Date of Patent: Aug. 9, 2022

(54) CONTACT STRUCTURES FOR GATE-ALL-AROUND DEVICES AND METHODS OF FORMING THE SAME

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 105 days.

(21) Appl. No.: 16/550,797

(22) Filed: Aug. 26, 2019

(65) Prior Publication Data

US 2020/0105889 A1 Apr. 2, 2020

Related U.S. Application Data

(60) Provisional application No. 62/737,388, filed on Sep. 27, 2018.

(51) Int. Cl.
*H01L 29/66* (2006.01)
*H01L 29/417* (2006.01)
(Continued)

(52) U.S. Cl.
CPC .... *H01L 29/41791* (2013.01); *H01L 29/0665* (2013.01); *H01L 29/66795* (2013.01); *H01L 29/785* (2013.01); *H01L 2029/7858* (2013.01)

(58) Field of Classification Search
CPC ......... H01L 29/41791; H01L 29/66795; H01L 29/0665; H01L 29/785; H01L 2029/7858;
(Continued)

(56) References Cited

U.S. PATENT DOCUMENTS 8,772,109 B2 7/2014 Colinge
8,785,285 B2 7/2014 Tsai et al.
(Continued)

OTHER PUBLICATIONS

Bardon, M. Garcia et al., "Power-performance Trade-Offs for Lateral NanoSheets on Ultra-Scaled Standard Cells," IEEE 2018 Symposium on VLSI Technology Digest of Technical Papers, Jun. 2018, pp. 143-144.

(Continued)

*Primary Examiner* — Ismail A Muse
(74) *Attorney, Agent, or Firm* — Haynes and Boone, LLP

(57) ABSTRACT

Gate-all-around (GAA) device and the manufacturing method thereof are disclosed herein. An exemplary integrated circuit (IC) device comprises a first nanostructure and a second nanostructure formed on a substrate, wherein each of the first nano structure and the second nanostructure includes a plurality of semiconductor layers and each of the first nanostructure and the second nanostructure includes a channel region and a source/drain (S/D) region; a first gate structure wrapping the plurality of semiconductor layers of the first nanostructure and a second gate structure wrapping the plurality of semiconductor layers of the second nanostructure; and a S/D contact that contacts at least one of the plurality of semiconductor layers of the first nanostructure and at least one of the plurality of semiconductor layers of the second nanostructure.

20 Claims, 37 Drawing Sheets

(51) Int. Cl.
*H01L 29/06* (2006.01)
*H01L 29/78* (2006.01)

(58) Field of Classification Search
CPC ..... H01L 21/823412; H01L 21/823418; H01L 29/401; H01L 29/1079; H01L 29/0653; H01L 29/66439; H01L 29/0692; H01L 27/088; H01L 29/0673; H01L 29/775; H01L 29/42392; H01L 29/78696; H01L 27/092; H01L 21/823828; H01L 21/823814; H01L 21/823807; H01L 29/42356; B82Y 10/00

See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,613,953 | B2 | 4/2017 | Liaw |
| 9,793,273 | B2 | 10/2017 | Liaw |
| 9,805,985 | B2 | 10/2017 | Liaw |
| 2007/0257323 | A1* | 11/2007 | Tsui ............... H01L 23/485 257/382 |
| 2017/0110554 | A1* | 4/2017 | Tak ............... H01L 29/42392 |
| 2018/0301341 | A1* | 10/2018 | Coquand ........ H01L 29/66742 |
| 2019/0058052 | A1* | 2/2019 | Frougier ........ H01L 29/6653 |
| 2019/0165135 | A1* | 5/2019 | Cheng ........... H01L 29/66553 |
| 2019/0181224 | A1* | 6/2019 | Zhang ............ B82Y 10/00 |
| 2019/0214502 | A1* | 7/2019 | Xu ............... H01L 29/66742 |
| 2019/0326288 | A1* | 10/2019 | Hashemi ........ B82Y 10/00 |
| 2019/0341496 | A1* | 11/2019 | Reznicek ........ H01L 27/092 |

OTHER PUBLICATIONS

Huang, Ya-Chi et al., "GAAFET Versus Pragmatic FinFET at the 5nm Si-Based CMOS Technology Node," Journal of the Electron Devices Society, vol. 5, No. 3, May 2017, pp. 164-169.

* cited by examiner

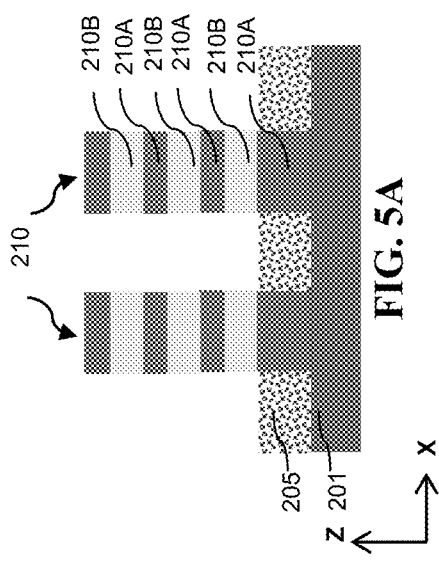
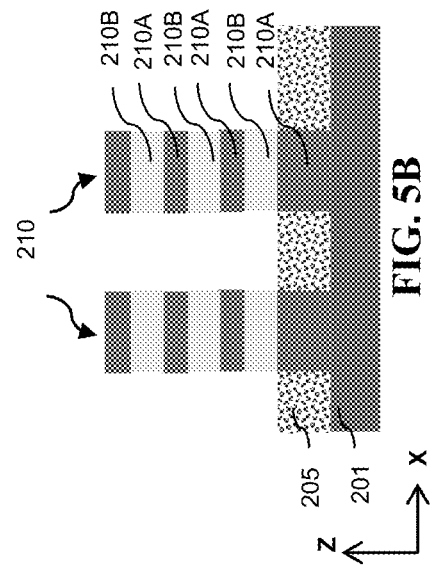
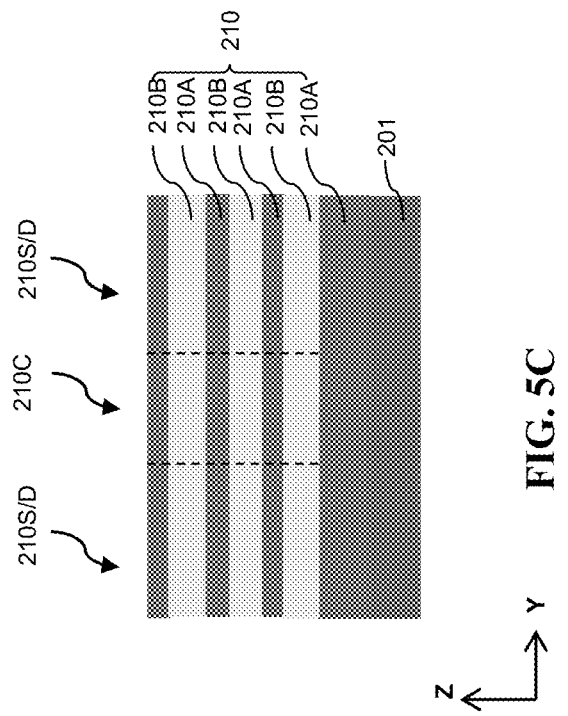

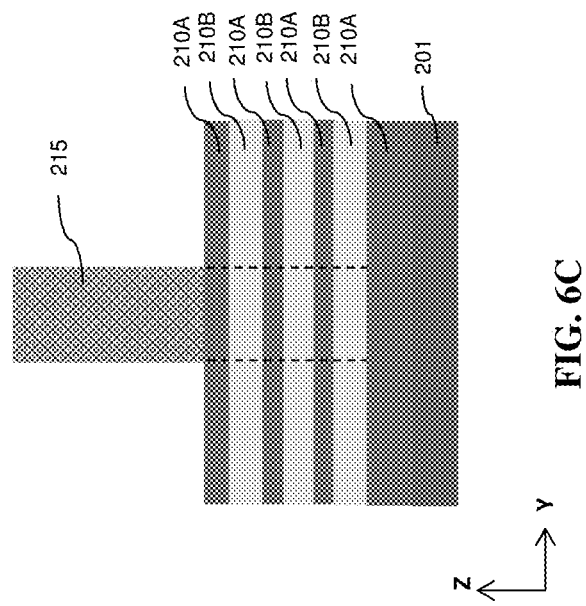
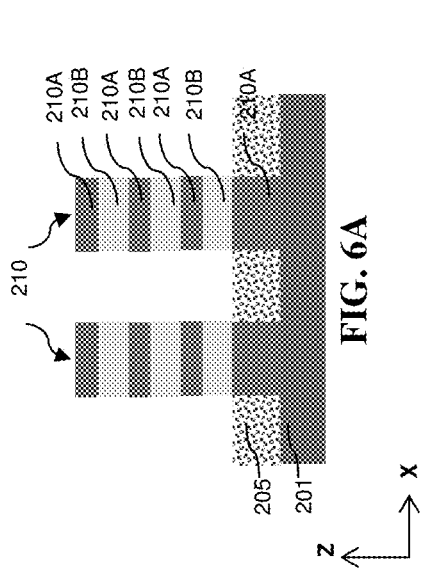
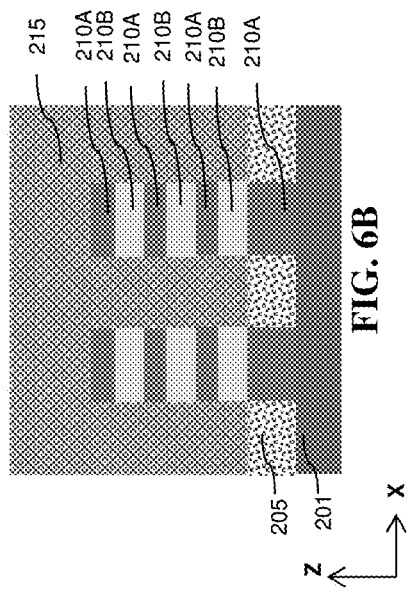

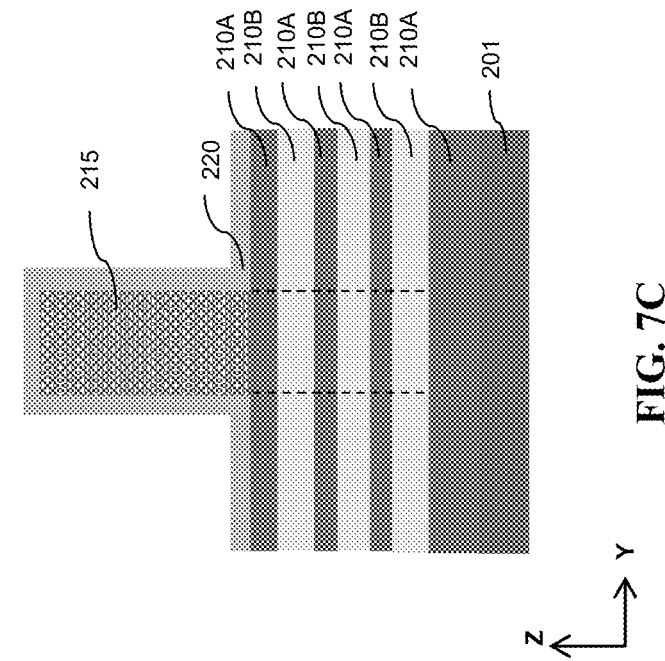
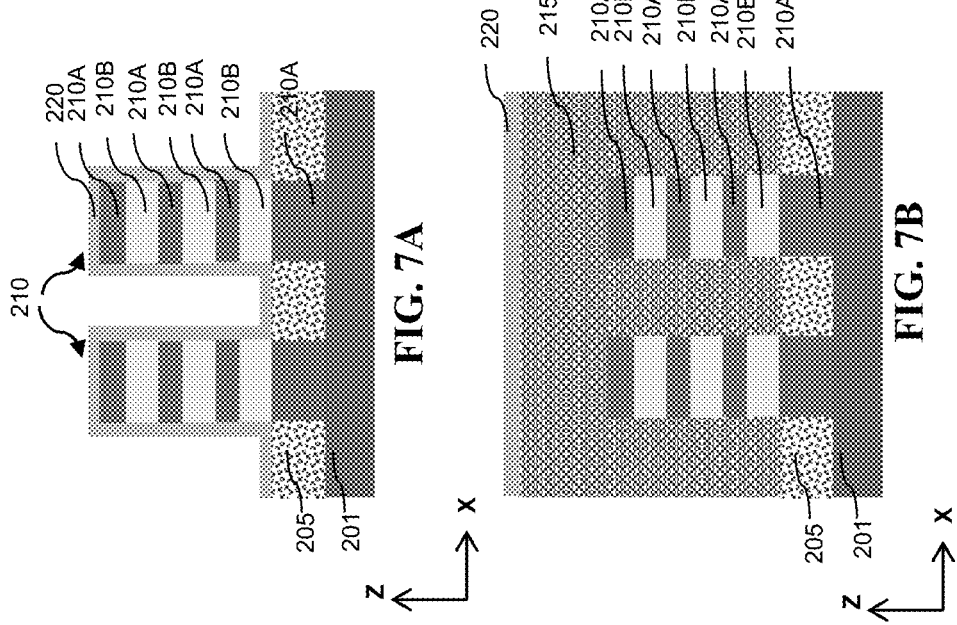

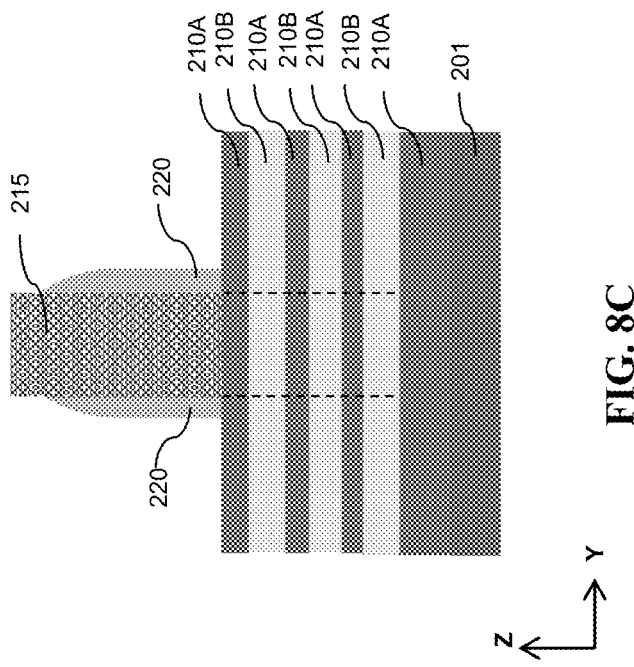
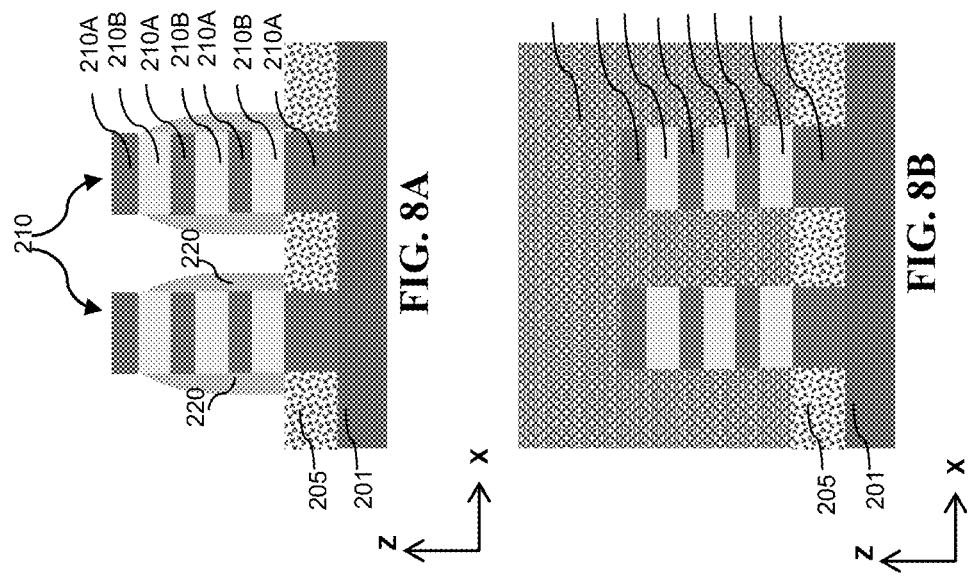
FIG. 8A
FIG. 8B
FIG. 8C

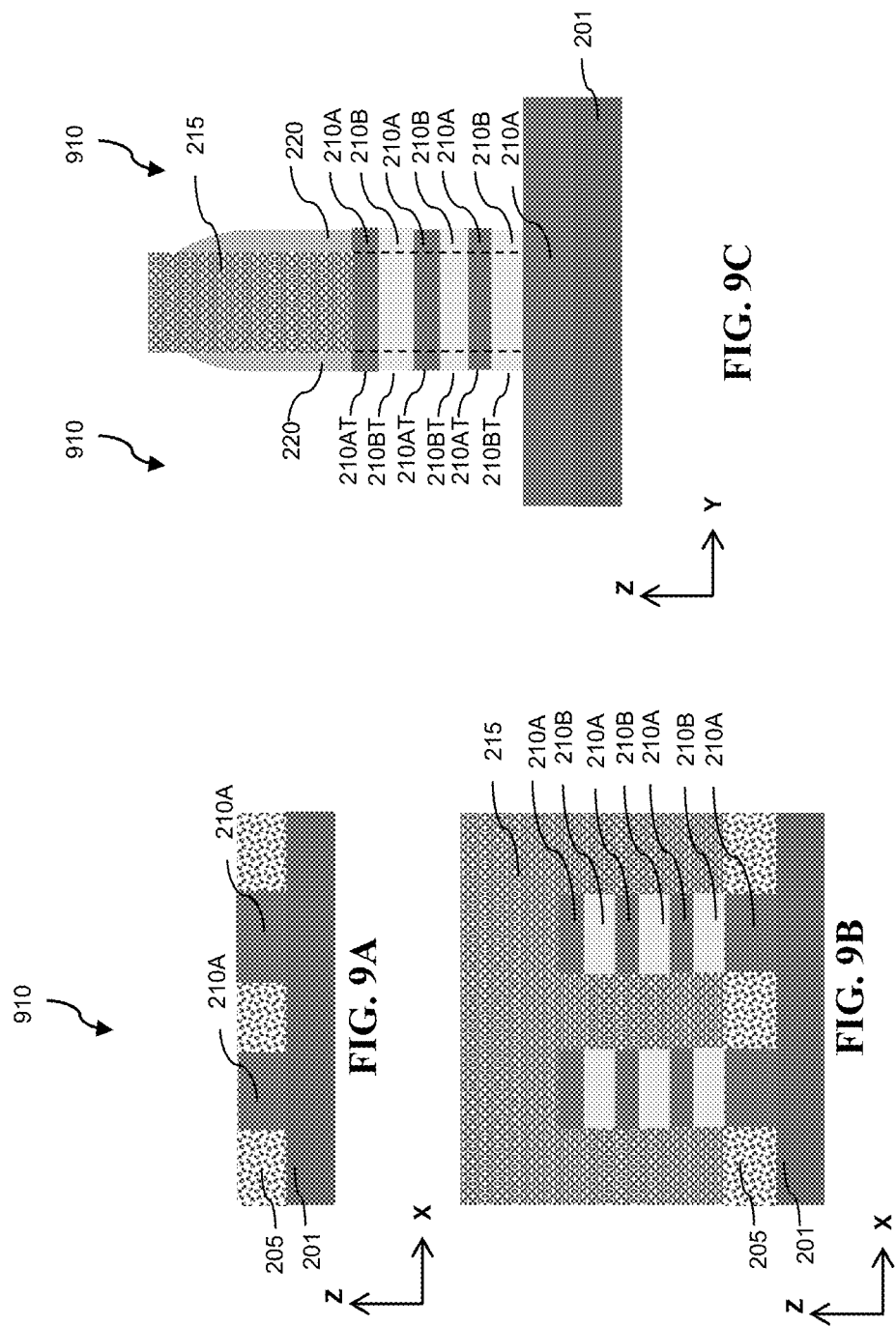

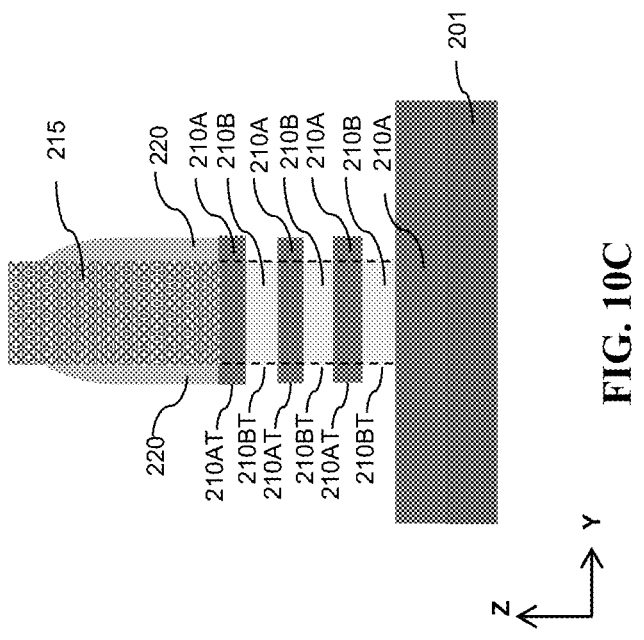
FIG. 10C
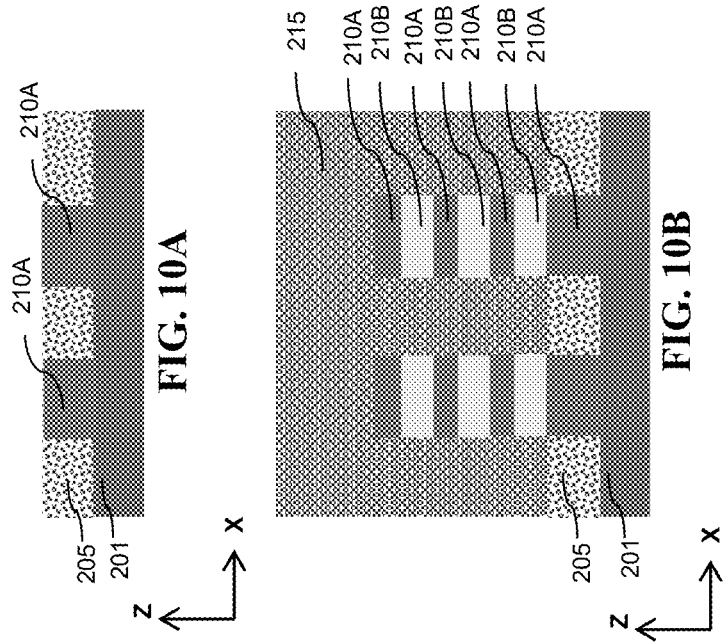
FIG. 10A
FIG. 10B

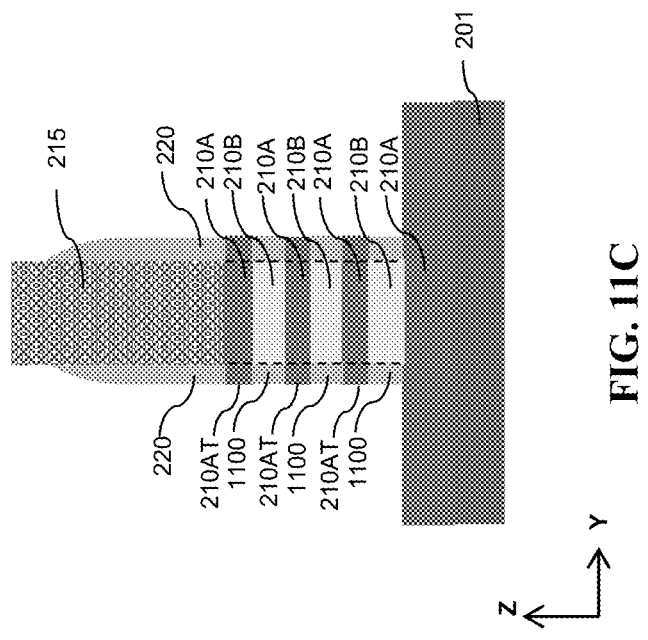
FIG. 11C
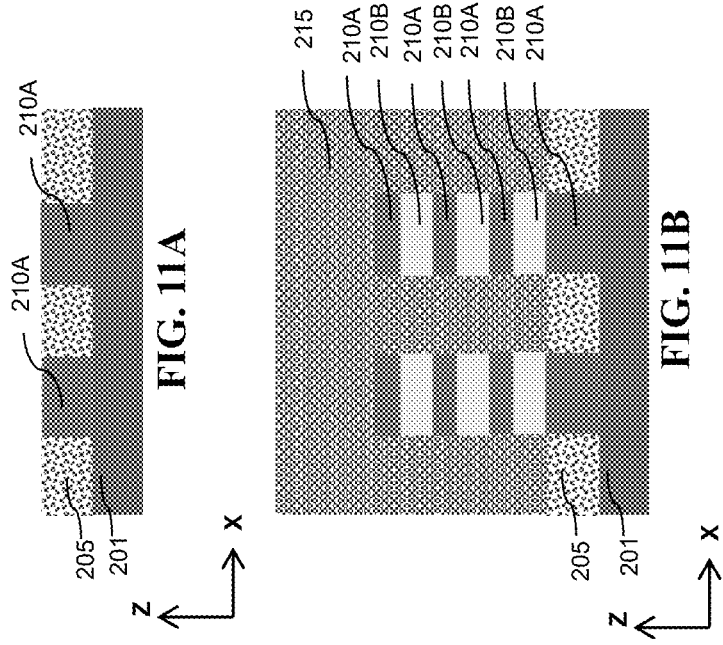
FIG. 11A
FIG. 11B

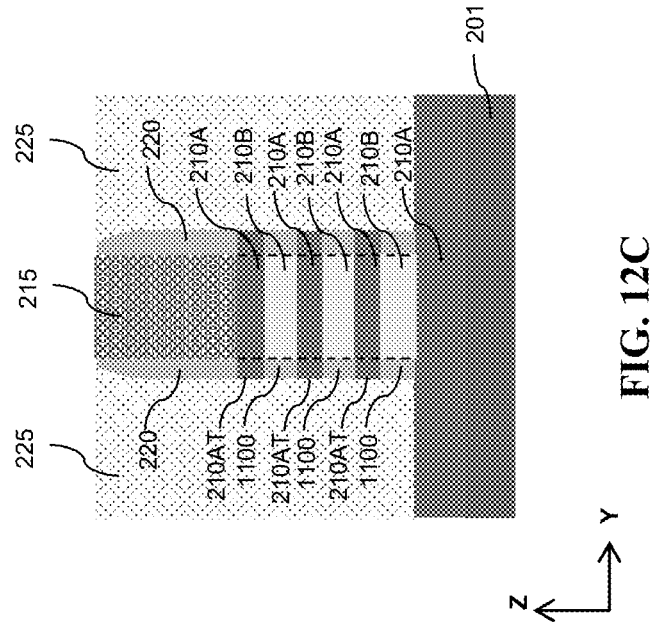
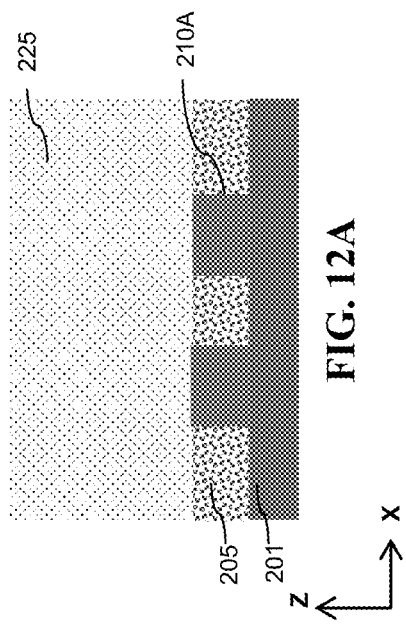
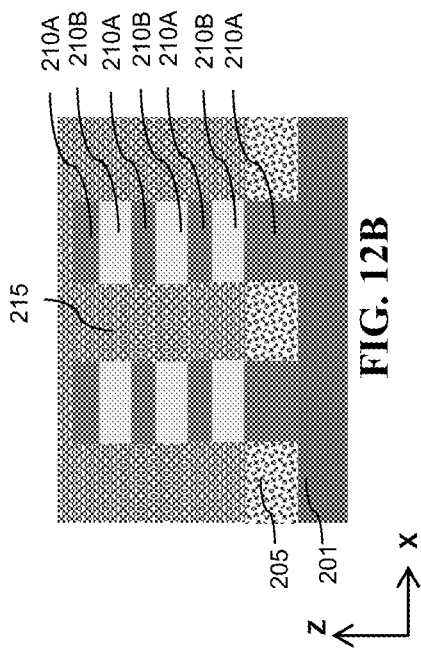
FIG. 12A
FIG. 12B
FIG. 12C

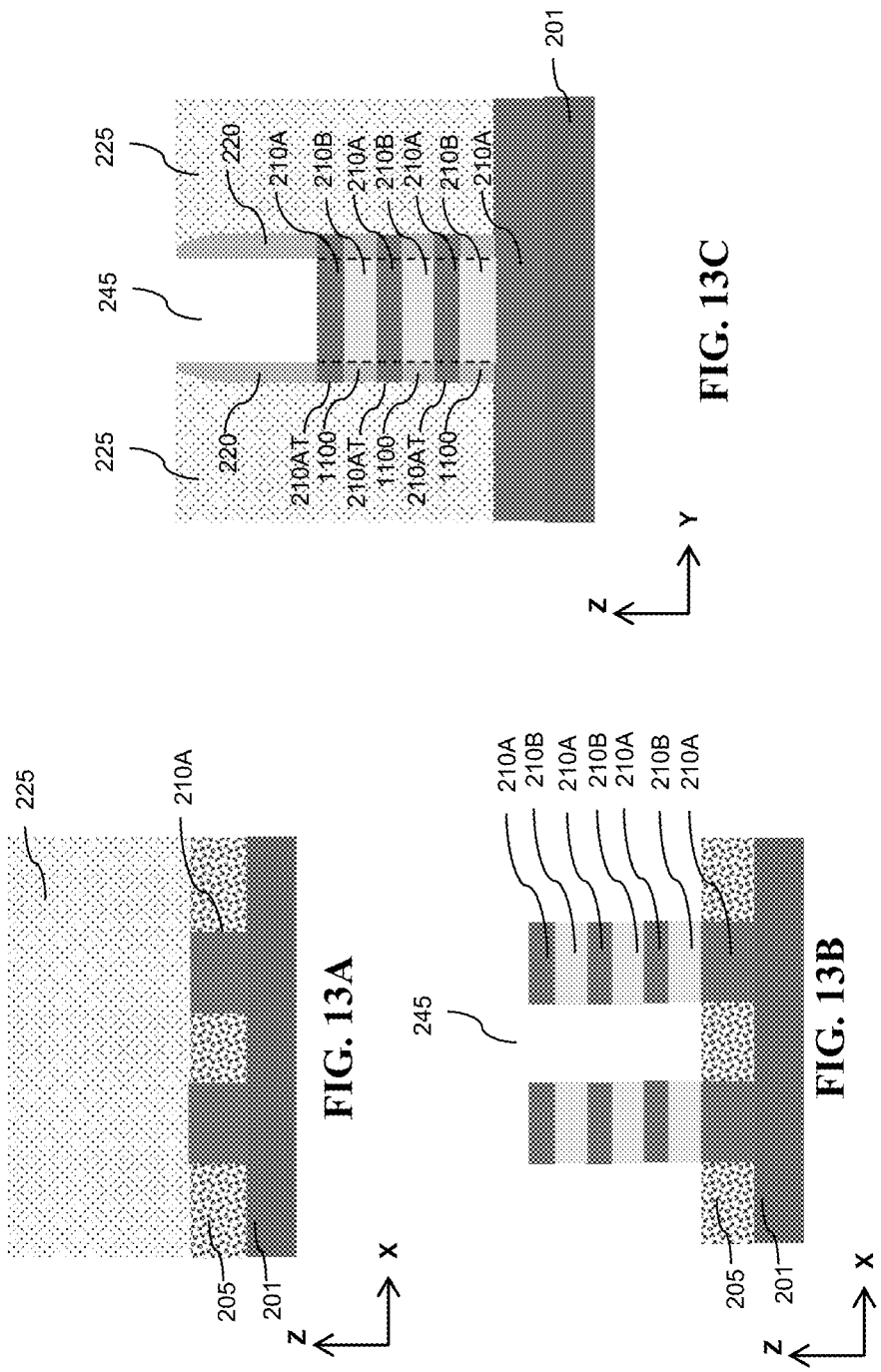

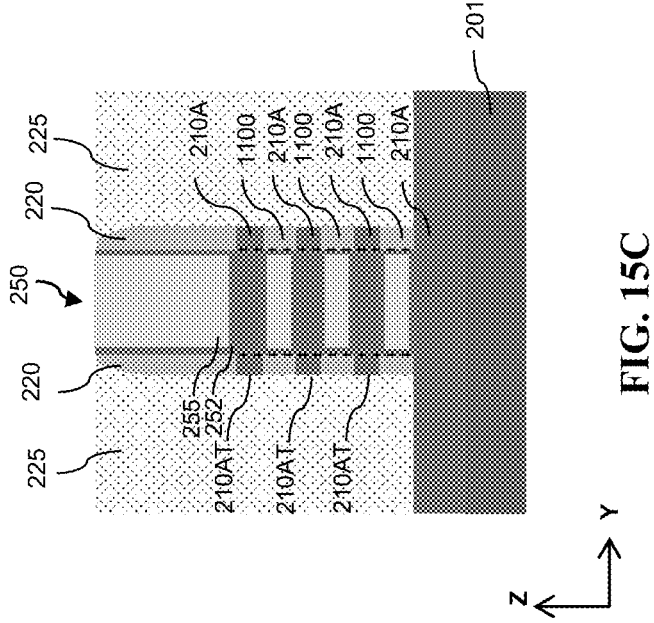
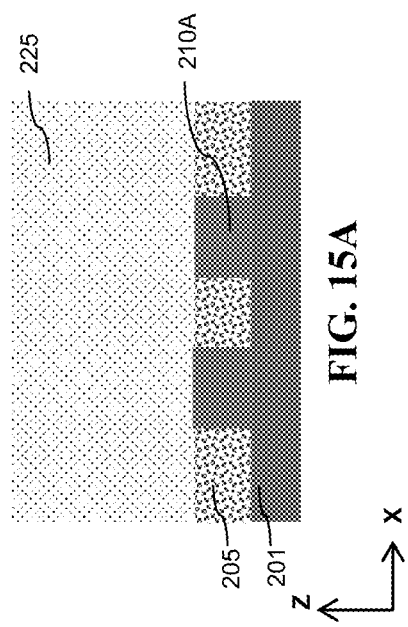
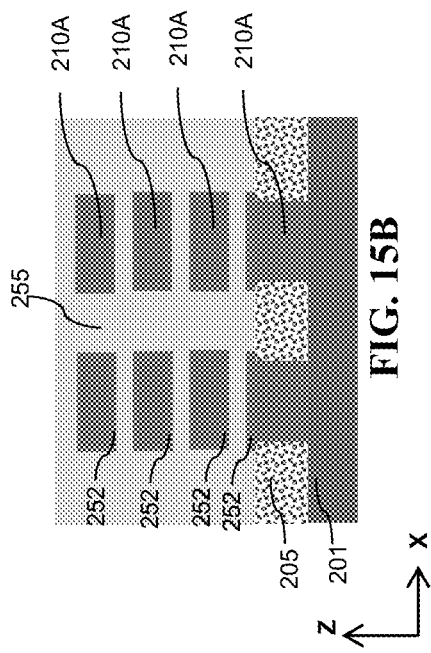

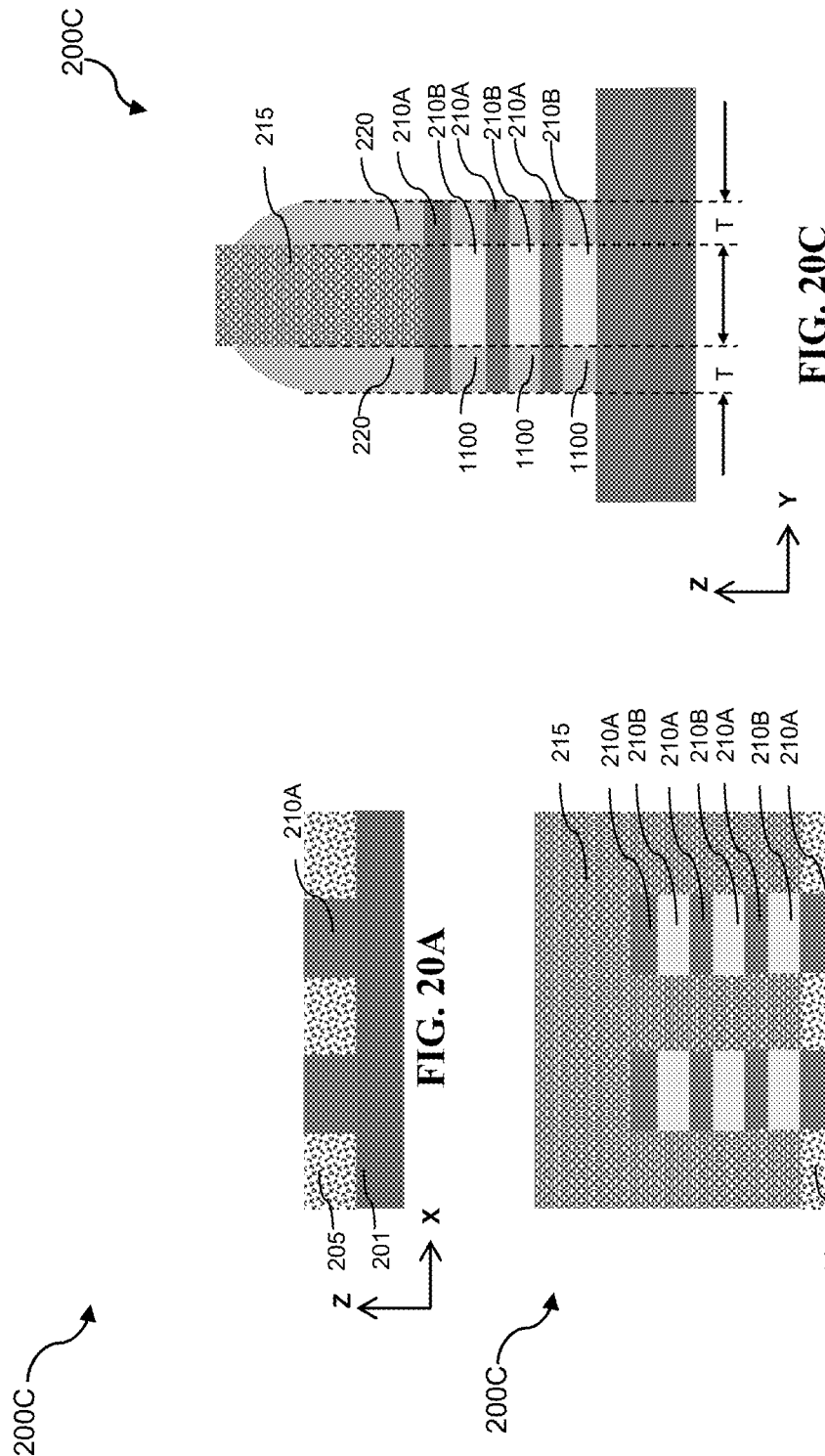

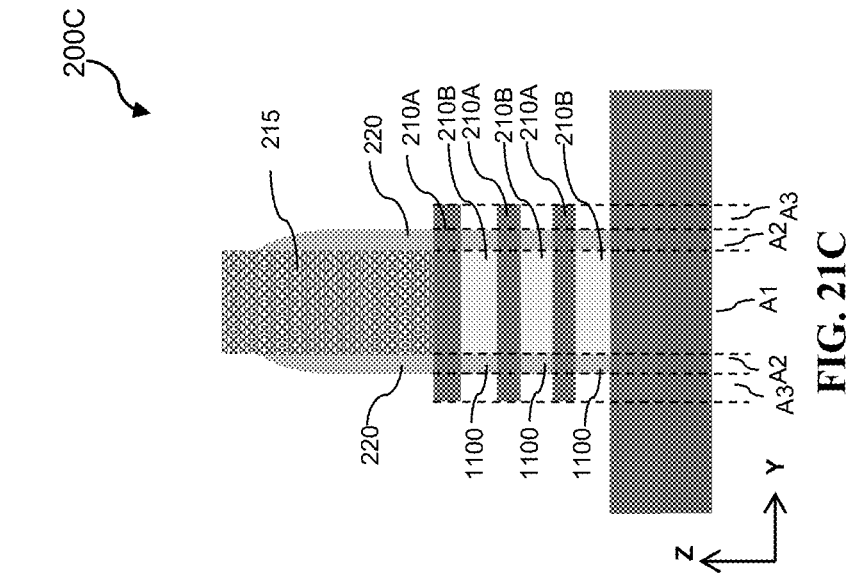
FIG. 21C
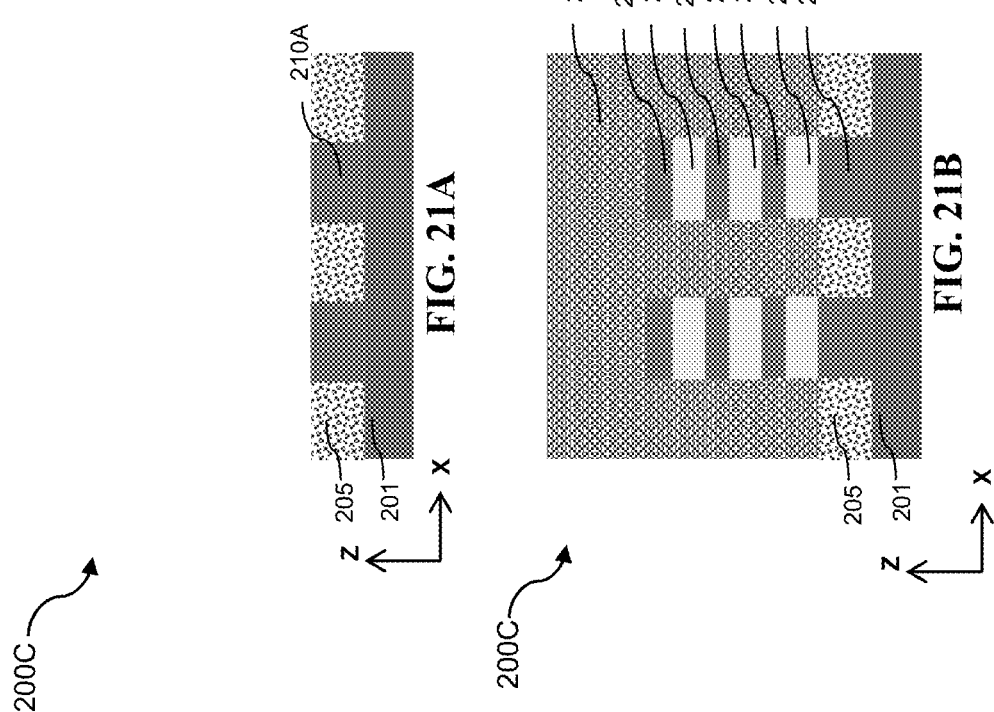
FIG. 21A
FIG. 21B

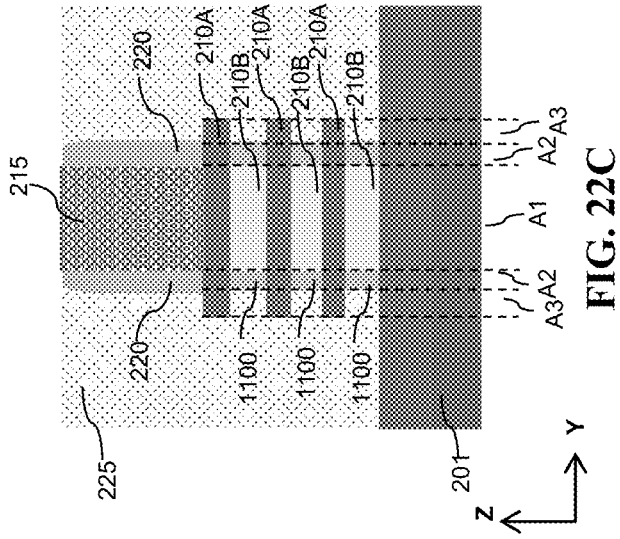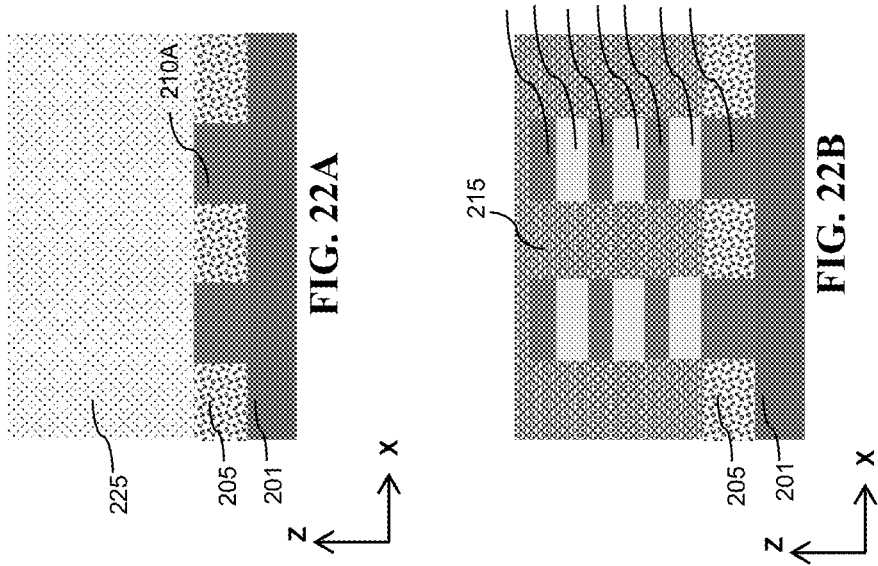

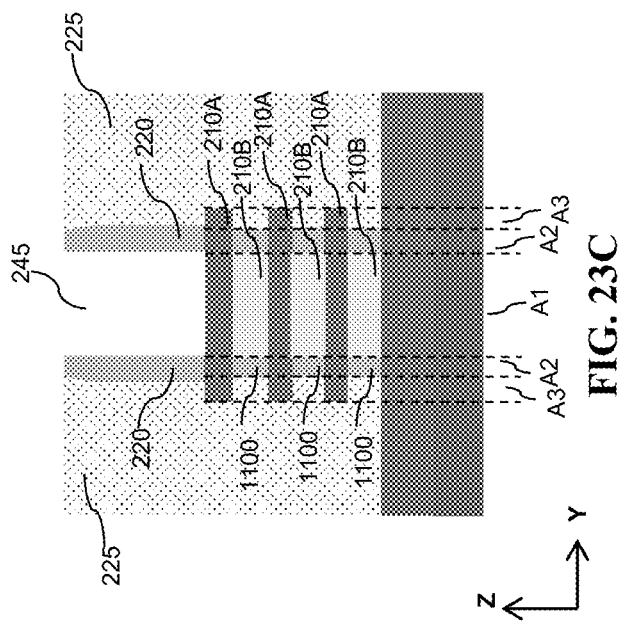
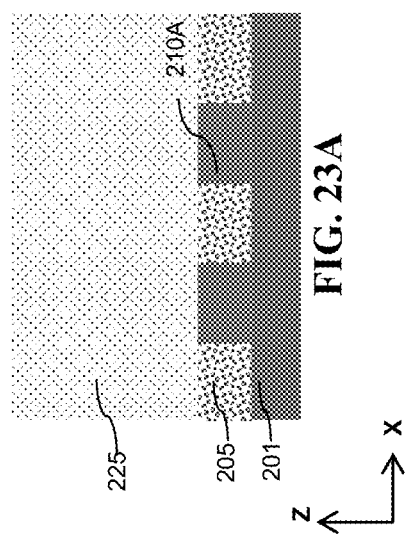
FIG. 23A
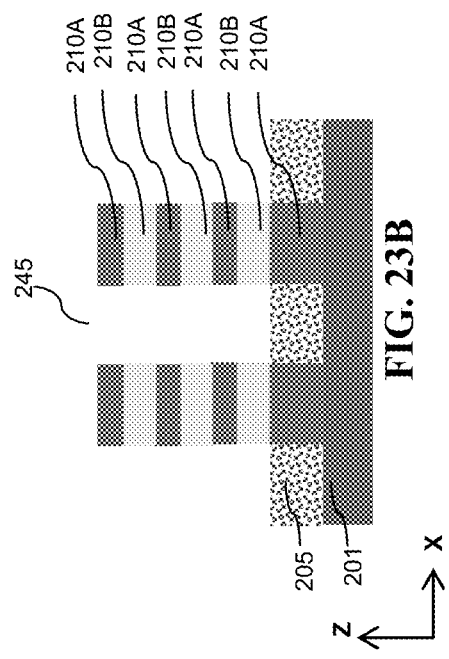
FIG. 23C
FIG. 23B

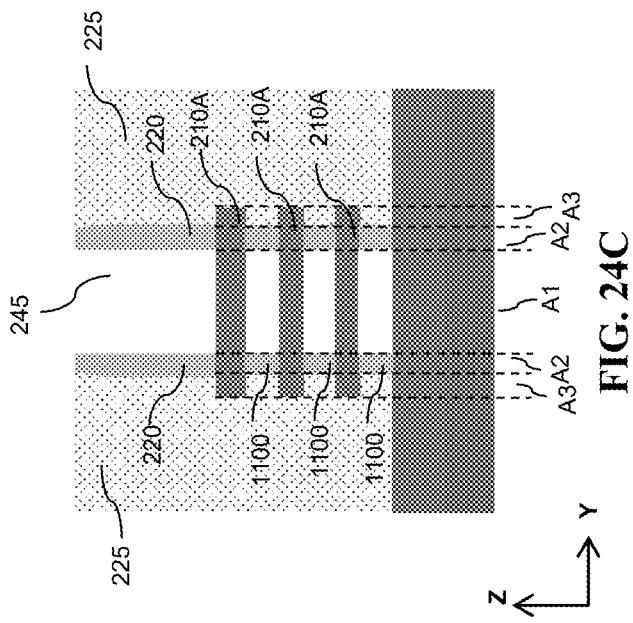
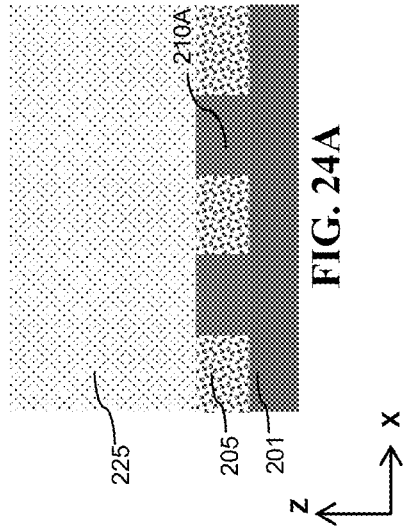
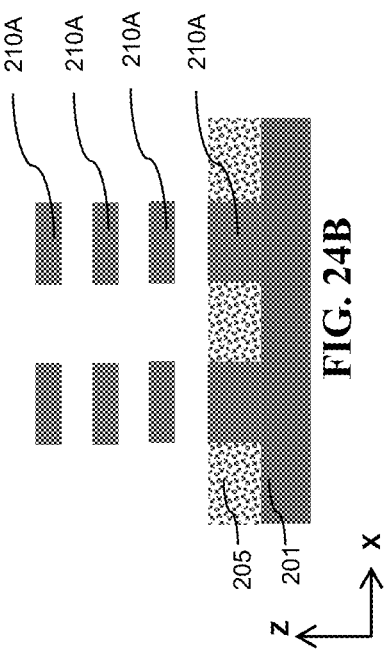
FIG. 24A
FIG. 24B
FIG. 24C

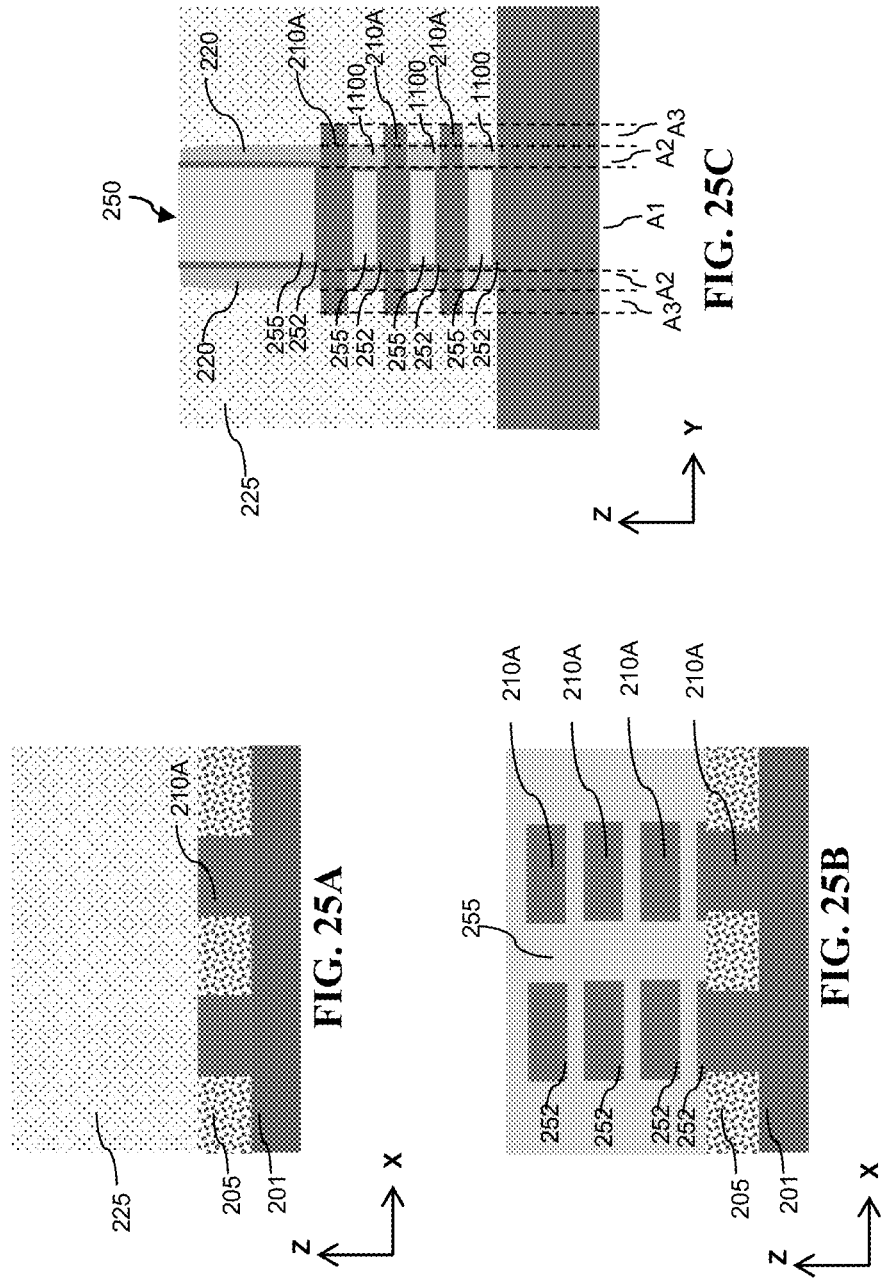

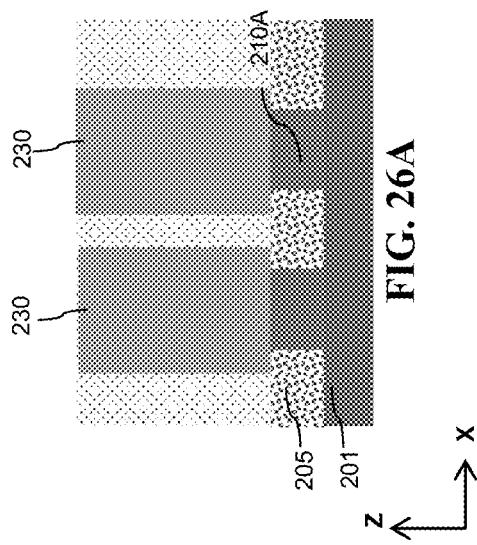
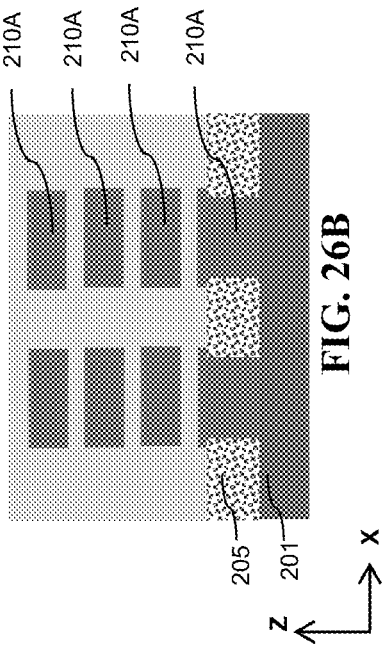
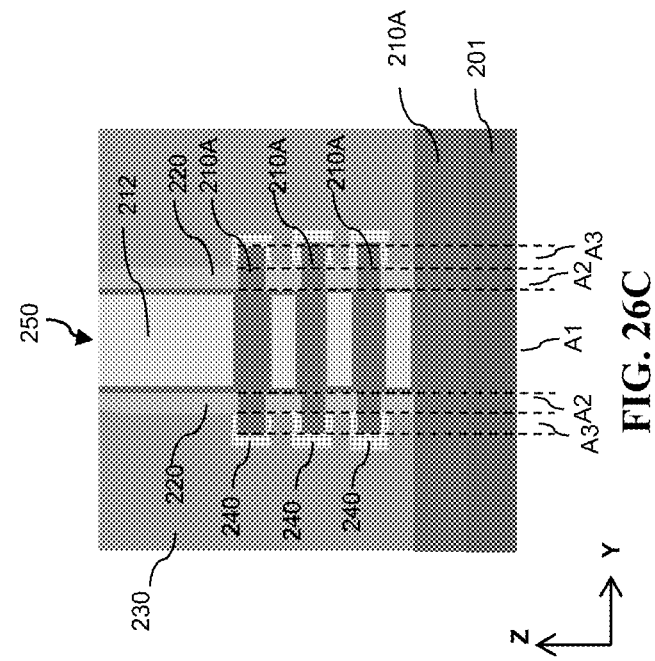

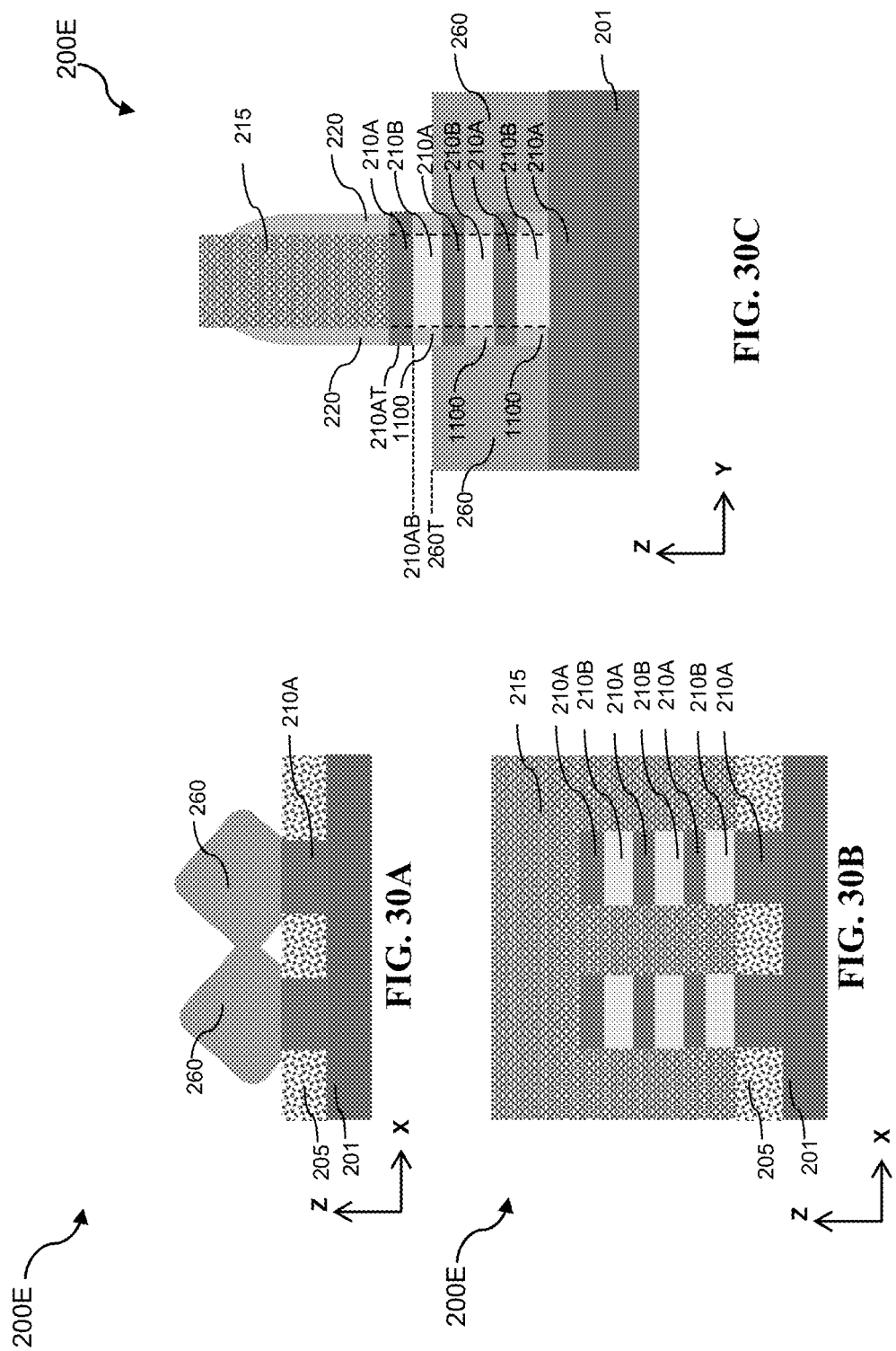

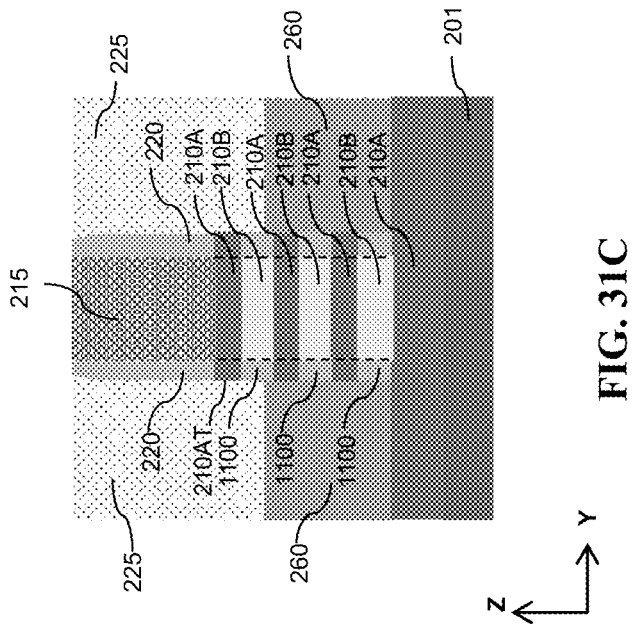
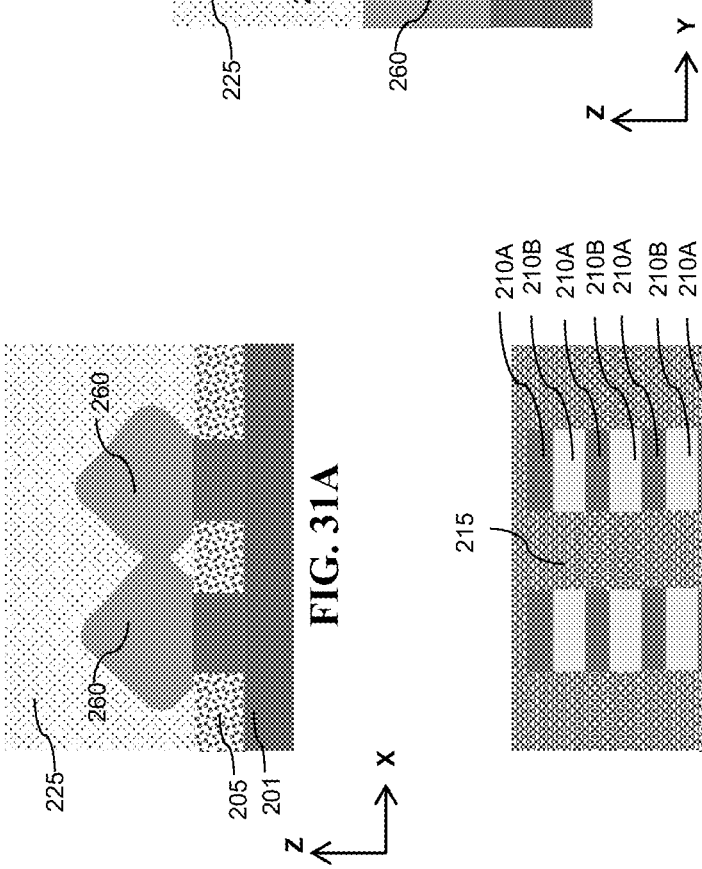
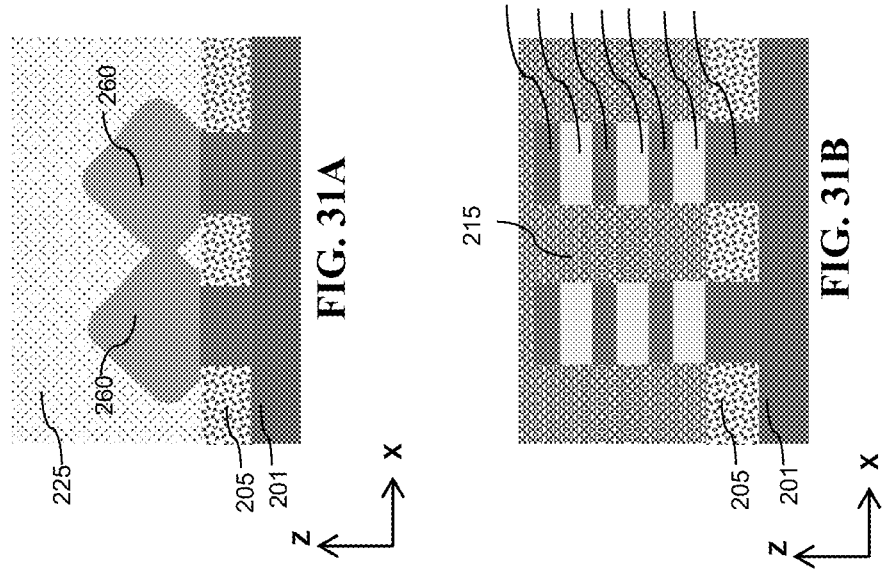

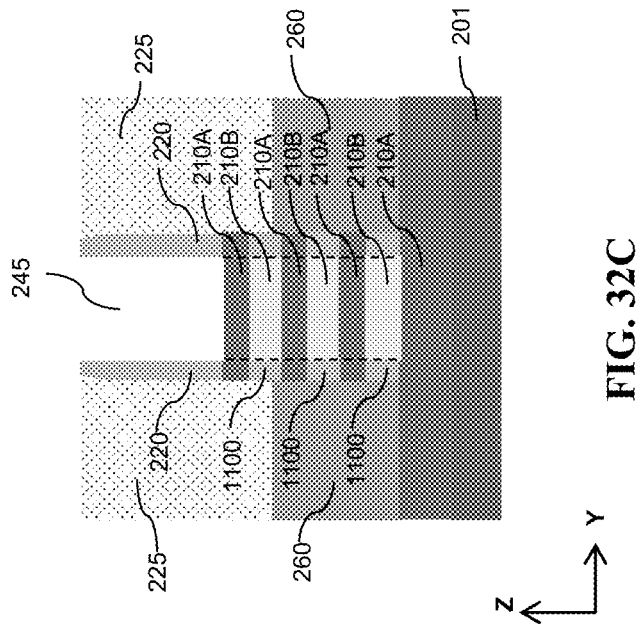
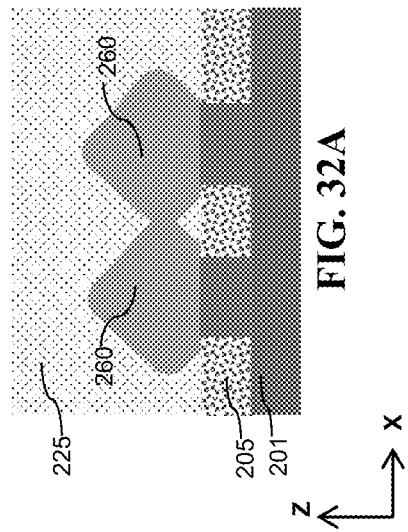
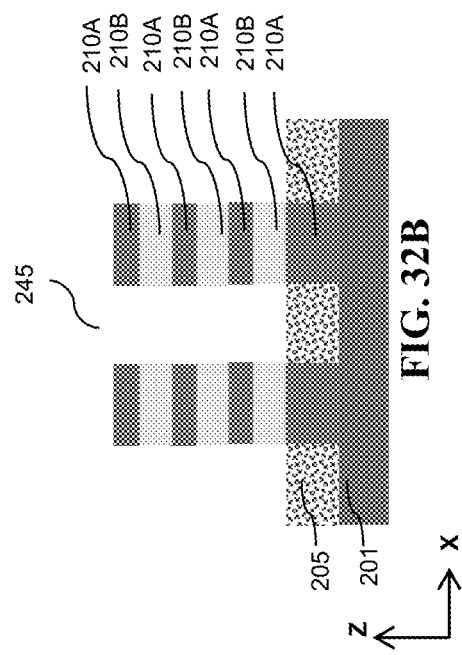
FIG. 32A
FIG. 32B
FIG. 32C

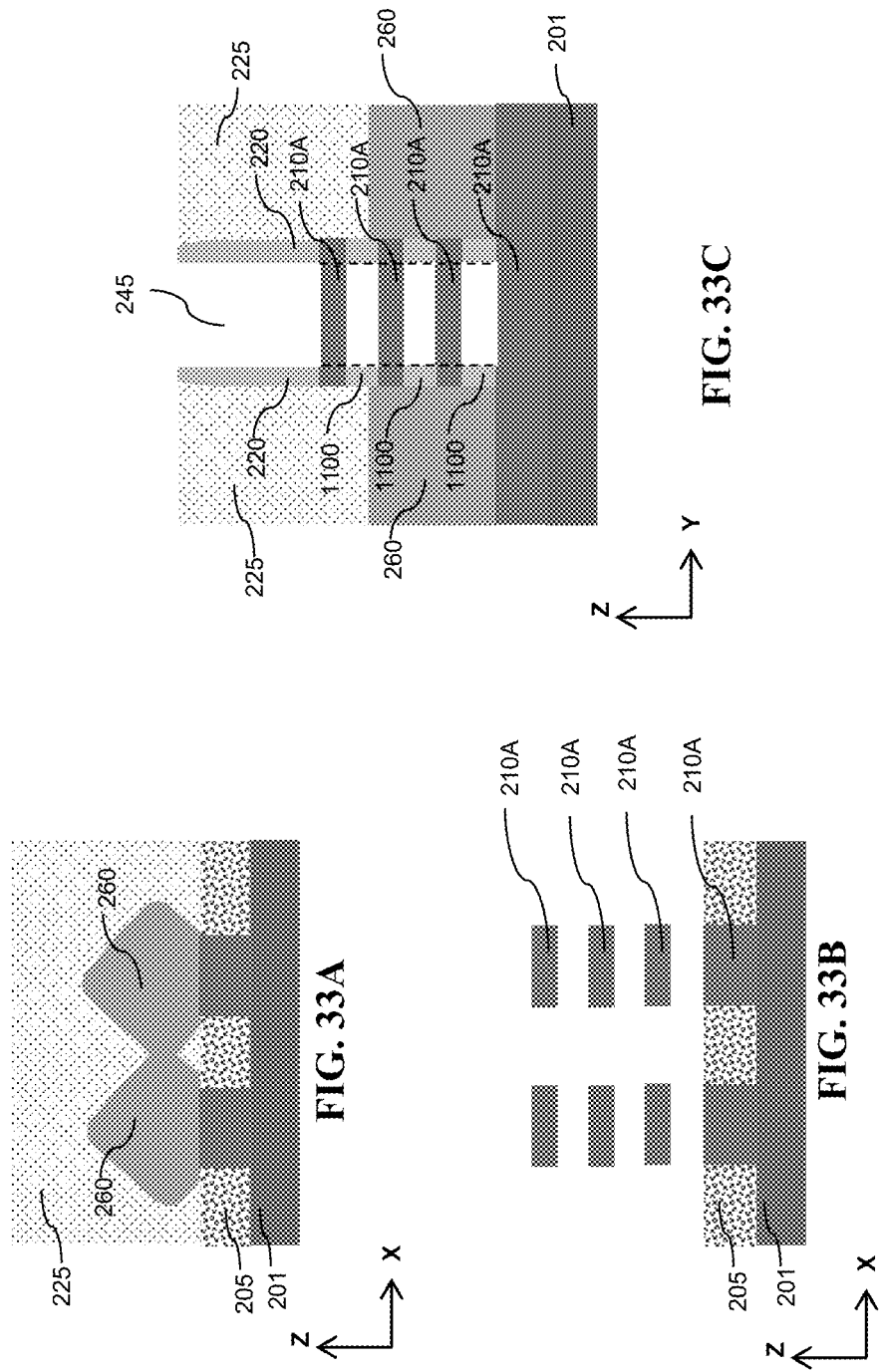

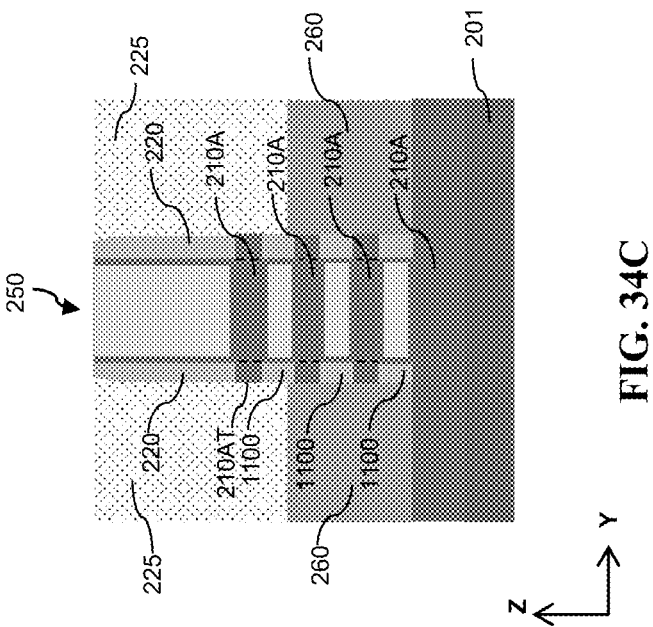
FIG. 34C
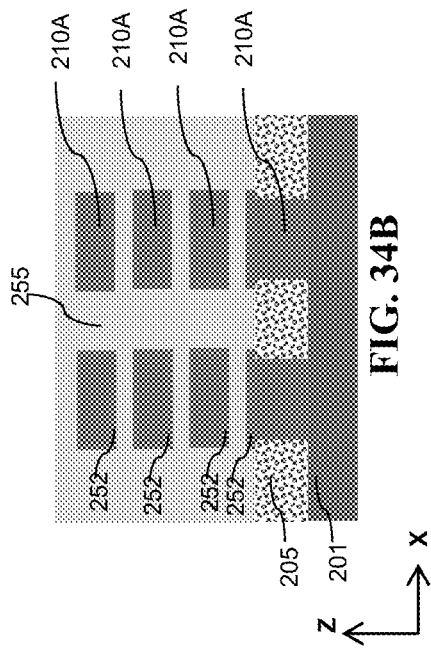
FIG. 34A
FIG. 34B

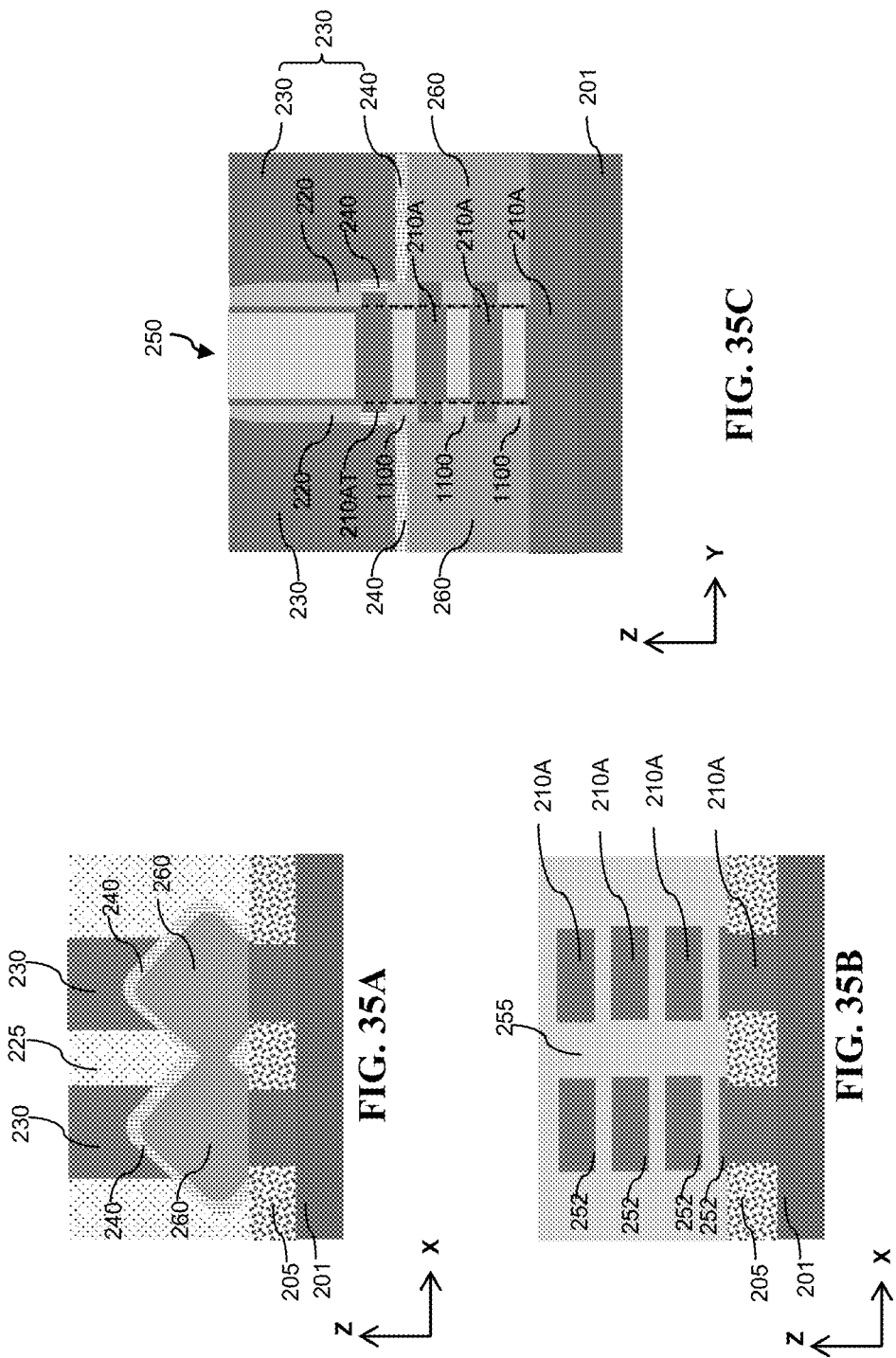

CONTACT STRUCTURES FOR GATE-ALL-AROUND DEVICES AND METHODS OF FORMING THE SAME

This is a non-provisional application of and claims benefit of U.S. Provisional Patent Application Ser. No. 62/737,388, filed Sep. 27, 2018, the entire disclosure of which is incorporated herein by reference.

BACKGROUND

Multi-gate devices have been introduced to improve gate control by increasing gate-channel coupling, reducing off-state current, and reducing short-channel effects (SCEs). One such multi-gate device is a gate-all-around (GAA) transistor, whose gate structure extends around a portion of its channel region, thereby providing access to the channel region on more than one side. GAA transistors are compatible with conventional complementary metal-oxide-semiconductor (CMOS) fabrication processes, allowing aggressive scaling down of transistors while maintaining gate control and mitigating SCEs. However, fabrication of GAA transistors presents challenges. For example, poor epitaxial source and drain growth has been observed in advanced technology node GAA transistors, which can degrade GAA transistors performance (for example, increasing source/drain (S/D) parasitic resistance and/or reducing on-current exhibited by GAA transistors).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-16A, 5B-16B, and 5C-16C are cross-sectional views of the block E-E of the example semiconductor device along plane A-A, B-B, and C-C shown in FIG. 4 at intermediate stages of the method of FIGS. 1 and 2 according to various embodiments of the present disclosure.

FIGS. 20A-26A, 20B-26B, and 20C-26C are cross-sectional views of the block E-E of the example semiconductor device along plane A-A, B-B, and C-C shown in FIG. 4 at intermediate stages of the method of FIGS. 1 and 19 according to various embodiments of the present disclosure.

FIGS. 30A-35A, 30B-35B, and 30C-35C are cross-sectional views of the block E-E of the example semiconductor device along plane A-A, B-B, and C-C shown in FIG. 4 at intermediate stages of the method of FIGS. 1 and 29 according to various embodiments of the present disclosure.

DETAILED DESCRIPTION

Figure 1:
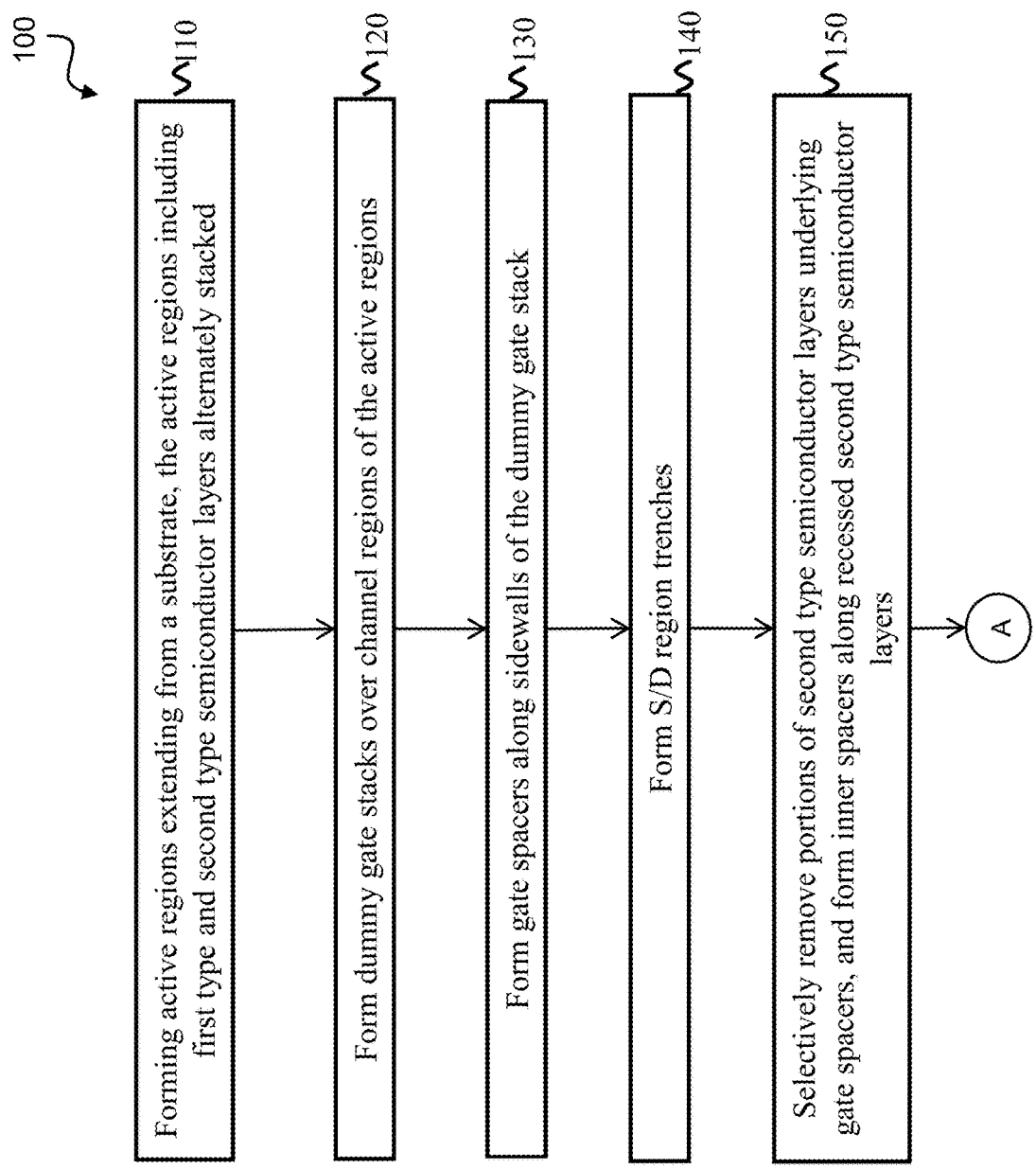
FIGS. 1 and 2 are flowcharts of an example method forming a semiconductor device, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure relates generally to integrated circuit (IC) devices, and more particularly, to gate-all-around (GAA) devices. Details of the S/D contact structures for GAA devices and methods of fabrication thereof are further described in the following pages and/or drawings.

For advanced integrated circuit (IC) technology nodes, GAA devices have become a popular candidate for high performance and low leakage applications since they allow more aggressive gate length scaling for both performance and density improvement than Fin-like Field-Effect-Transistor (FinFET) device. A GAA device generally refers to any device having a gate structure, or portions thereof, formed on more than one side of a channel region (for example, surrounding a portion of the channel region). The channel region of a GAA device may be formed from nanowires, nanosheets, other nanostructures, and/or other suitable structures. In some embodiments, the channel region of a GAA device includes multiple nanowires/nanosheets (which extend horizontally, thereby providing horizontally-oriented channels) vertically stacked. The present disclosure is generally related to source/drain (S/D) contact structures for GAA devices to mitigate disadvantages arising from formation of epitaxial S/D features in advanced technology nodes. S/D contact structures disclosed herein have been observed to reduce parasitic S/D resistance and/or improve on-current, thereby improving current flow between the S/D contacts and the channel regions.

Figure 2:
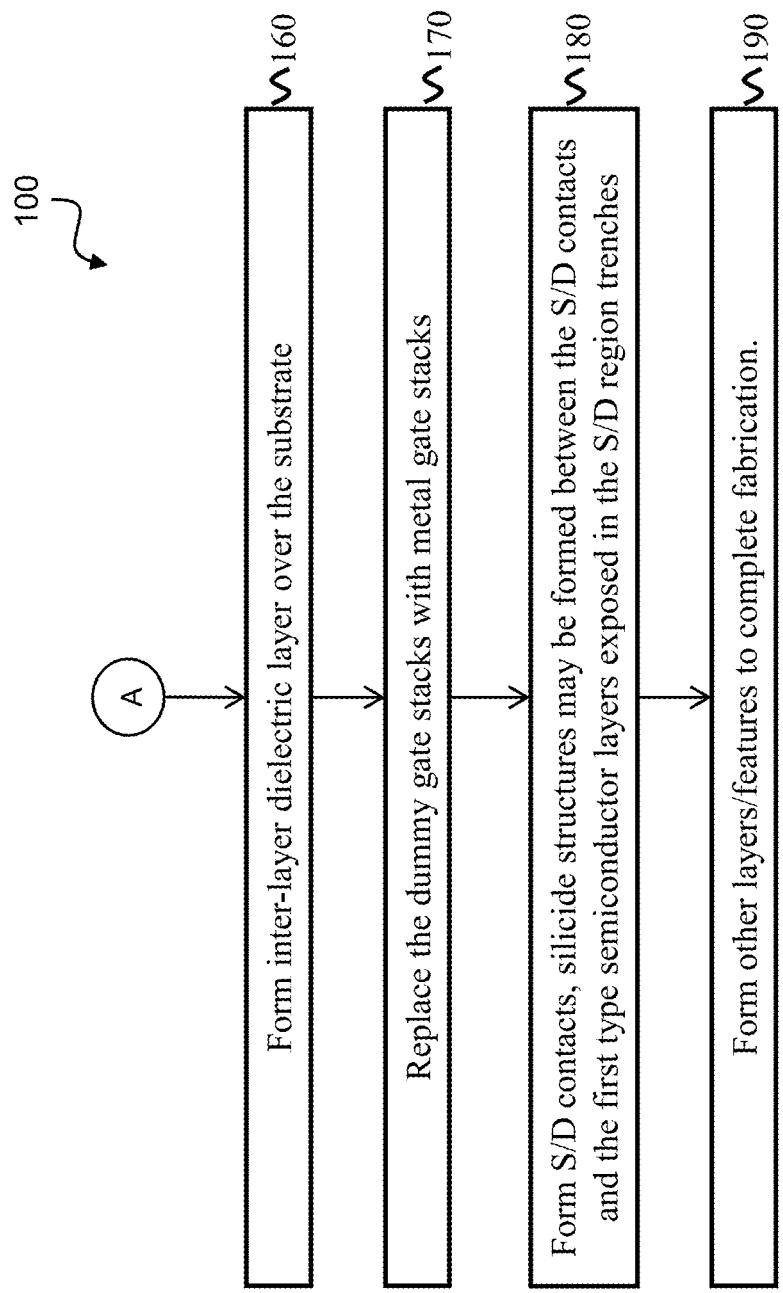
Figure 3:
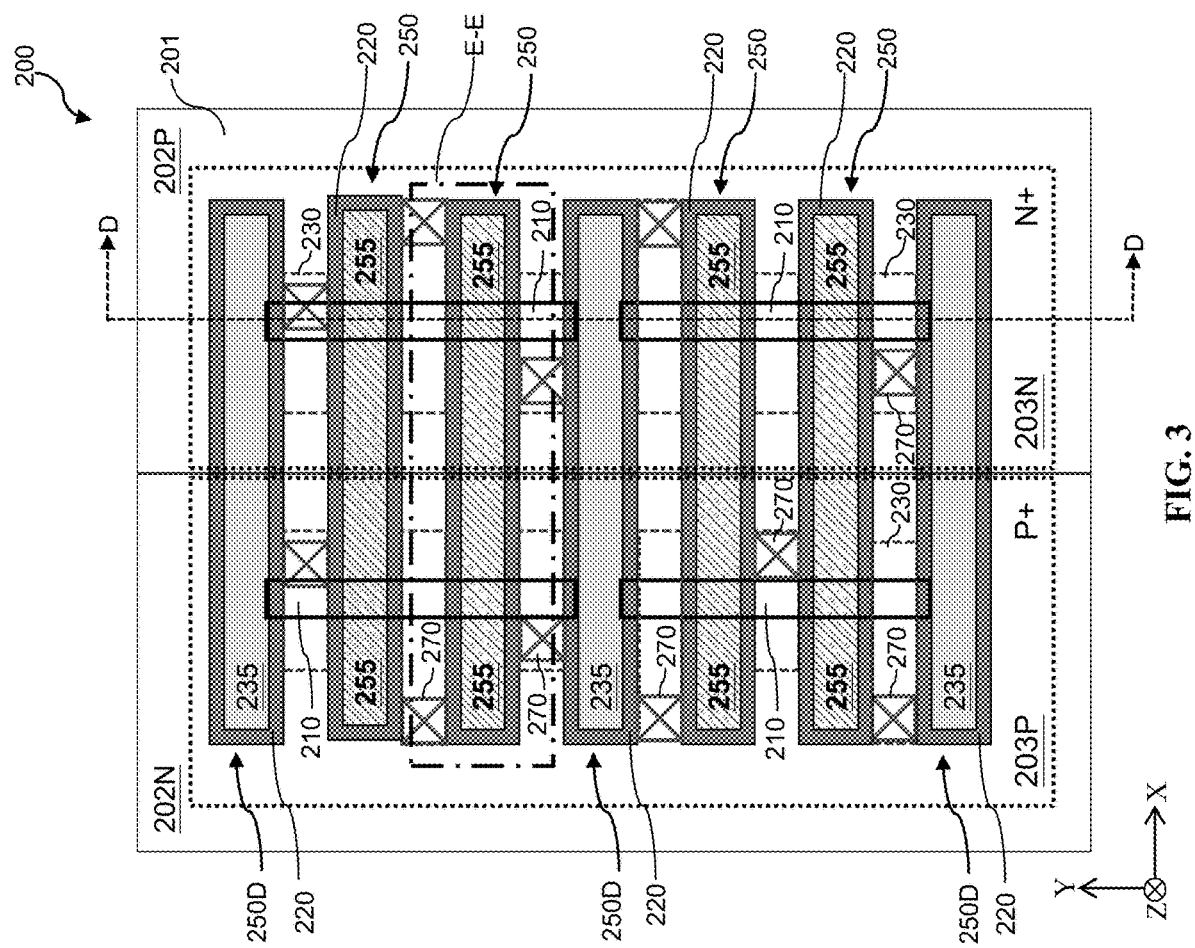
FIG. 3 is a schematic top view of an example semiconductor device, according to various embodiments of the present disclosure.
Figure 4:
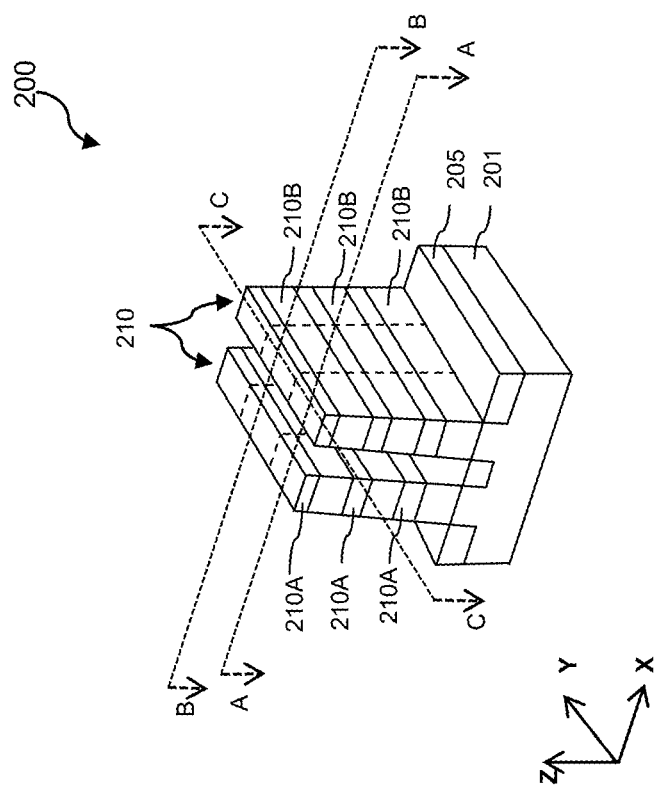
FIG. 4 is a three-dimensional perspective view of the block E-E of the example semiconductor device of FIG. 3 according to various embodiments of the present disclosure.

FIGS. 1 and 2 illustrate a flowchart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various planar top views, three-dimensional views, and cross-sectional views of device 200 during intermediate steps of method 100. In particular, FIG. 3 illustrates a top view of device 200. FIG. 4 illustrates a three-dimensional view of a portion of the device 200 identified as the block E-E of device 200 in FIG. 3. FIGS. 5A-16A illustrate cross-sectional views of a portion of the device 200 identified as block E-E of device 200 in FIG. 3 taken along plane A-A in FIG. 4 (that is, along an x-direction). FIGS. 5B-16B illustrate cross-sectional views of block E-E of device 200 taken along plane B-B in FIG. 4 (that is, also along the x-direction); and FIGS. 5C-16C illustrate cross-sectional views of block E-E of device 200 taken along plane C-C in FIG. 4 (that is, along a y-direction). FIG. 17 is a cross-sectional view of device 200 taken along plane D-D shown in FIG. 3 at intermediate stage of the method of FIGS. 1 and 2 according to various embodiments of the present disclosure. It is noted that FIG. 17 illustrates an embodiment of a device 200, in further figures, other embodiments of the device 200, including those labeled 200B, 200C, and so forth are provided. These embodiments may include many of the same features, fabricated in the same manner, with differences specifically noted in their description.

FIG. 3 is a schematic figure of a semiconductor device 200 (for example, in an x-y plane), in portion or entirety, according to various embodiments of the present disclosure. Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC) or portion thereof. The present disclosure is not limited to any particular number of devices or device regions, or to any particular device configurations. For example, though device 200 as illustrated is a three-dimensional FET device (e.g., a gate-all-around (GAA) transistor), the present disclosure may also provide embodiments for fabricating planar FET devices. The figures have been simplified for the sake of clarity to better understand the inventive concepts of the present disclosure. Additional features can be added in device 200, and some of the features described below can be replaced, modified, or eliminated in other embodiments of device 200.

Device 200 includes a substrate (wafer) 201. The substrate 201 includes various doped regions configured according to design requirements of device 200. In the depicted embodiment, substrate 201 includes a p-type doped region 202P (for example, p-type well) doped with p-type dopants, such as boron (for example, $^{11}$B, $BF_2$), indium (In), other p-type dopant, or combinations thereof. Substrate 201 may also include a n-type doped regions 202N (for example, n-type wells) doped with n-type dopants, such as phosphorus (for example, $^{31}$P), arsenic (As), other n-type dopant, or combinations thereof. An ion implantation process, a diffusion process, and/or other suitable doping process can be performed to form the various doped regions. In the depicted embodiment, the n-type doped region 202N is configured for a p-type GAA transistor 203P, and the p-type doped region 202P is configured for an n-type GAA transistor 203N.

Device 200 also includes active regions 210 disposed over substrate 201. Each of the active regions 210 includes at least one channel region, at least one source region, and at least one drain region defined along their length in the y-direction, where a channel region is disposed between a source region and a drain region (generally referred to as source/drain (S/D) regions). Gate structures 250 including gate electrodes 255 and spacers 220 disposed along sidewalls of the gate electrodes 255. The gate electrodes 255 disposed over the channel regions of the active regions 210. Each of the gate structures 250 may include other components such as one or more a gate dielectric layer, a barrier layer, a glue layer, a capping layer, a hard mask layer, other suitable layers, or combinations thereof. Device 200 may also include dielectric dummy gate structures 250D to isolate different features/regions of the device 200 according to the design requirements of device 200. Dielectric dummy gate structures 250D may comprises dielectric dummy gate stack 235 and gate spacers 220. Device 200 may also include S/D contacts 230 (device-level contacts) disposed over the S/D regions of the active regions 210. In some embodiments, each of the S/D contacts 230 has a rectangular shape in the x-y plane, wherein a length of the S/D contact in the x-direction is at least 1.5 times of a width of the S/D contact in the y-direction. Vias 270 are disposed over the device-level contacts to work together to electrically couples various components (for example, gate structures and/or source/drain features) of the device 200 and/or devices (for example, transistors, resistors, capacitors, and/or inductors), such that device 200 can operate as specified by the design requirements. It is understood components included in device 200 are not limited to the numbers and configurations as shown in FIG. 2. More or less components, for example, more or less gate structures and/or S/D features, may be included in device 200.

In the following discussion, block E-E of FIG. 3 is taken as an illustration example to show the fabrication process of device 200.

According to FIGS. 1, 4, and 5A-5C, at operation 110, one or more active regions 210 are formed extending from a substrate 102 and each active region 210 includes a stack of semiconductor layers 210A and 210B. Referring to FIG. 4, in the present embodiment, the device 200 includes two active regions 210, and each active region 210 includes three semiconductor layers 210A and three semiconductor layers 210B. The two active regions 210 are oriented lengthwise along the "y" direction and are arranged side by side along the "x" direction. The lower portions of the active regions 210 are separated by an isolation structure 205. The semiconductor layers 210A and 210B are vertically stacked (along the "z" direction) in an alternating fashion (e.g., a first layer 210B disposed over a first layer 210A, a second layer 210A disposed over the first layer 210B, and a second layer 210B disposed over the second layer 210A, and so on). In various embodiments, the device 200 may include any number of active regions 210 and the active regions 210 may include any number of (for example, 4 to 20) alternately stacked semiconductor layers 210A and 210B.

Still referring to FIGS. 4 and 5A-5C, the active regions 210 each include two source/drain (S/D) regions 210S/D and a channel region 210C between the S/D regions 210S/D. The "A-A" line is taken across one of the S/D regions 210S/D, the "B-B" line is taken across the channel region 210C, and the "C-C" line is taken lengthwise across one of the active regions 210.

In embodiments, the substrate 201 may be a semiconductor substrate such as a silicon substrate. The substrate 201 may include various layers, including conductive or insulating layers formed on a semiconductor substrate. The substrate 201 may include various doping configurations as discussed above. The substrate 201 may also include other semiconductors such as germanium, silicon carbide (SiC), silicon germanium (SiGe), or diamond. Alternatively, the substrate 201 may include a compound semiconductor and/or an alloy semiconductor. Further, the substrate 201 may optionally include an epitaxial layer, may be strained for performance enhancement, may include a silicon-on-insulator structure, and/or have other suitable enhancement features. Semiconductor-on-insulator substrates can be fabricated using separation by implantation of oxygen (SIMOX), wafer bonding, and/or other suitable methods.

The isolation structure 205 may be formed of silicon oxide, silicon nitride, silicon oxynitride, fluoride-doped silicate glass, a low-k dielectric material, and/or other suitable insulating material. The isolation structure 205 may be shallow trench isolation (STI) features.

The two active regions 210 extend in the "y" direction and are spaced from one another along the "x" direction. The semiconductor layers 210A and 210B may have same or different thicknesses. The thickness of each of the semiconductor layers 210A and 210B may range from few nanometers to few tens of nanometers. In some embodiments, the first layer of 210A (which is partially buried in the isolation structure 205) may be much thicker than other semiconductor layers 210A and 210B. The two semiconductor layers 210A and 210B have different compositions. In various embodiments, the two semiconductor layers 210A and 210B provide for different oxidation rates and/or different etch selectivity. In an embodiment, the semiconductor layers 210A include silicon (Si) and the semiconductor layers 210B include silicon germanium (SiGe). To further this embodiment, the Si layer 210A may be undoped or substantially dopant-free. In other words, in some embodiments, no intentional doping is performed when forming the Si layer 210A. Alternatively, the Si layer 210A may be intentionally doped. For example, the Si layer 210A may be doped with a p-type dopant such as boron (B), aluminum (Al), indium (In), and gallium (Ga) for forming a p-type region, or an n-type dopant such as phosphorus (P), arsenic (As), antimony (Sb), for forming an n-type region. Furthermore, the SiGe layer 210B may include more than 25% Ge in molar ratio. For example, Ge may comprise about 25% to 50% of the SiGe layer 210B in molar ratio. In various embodiments, either of the semiconductor layers 210A and 210B may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210A and 210B may be chosen based on providing differing oxidation rates and/or etch selectivity.

The operation 110 may include a variety of processes such as deposition, epitaxy, photolithography, and etching. For example, in a fin-first scheme, first, alternative semiconductor layers are epitaxially grown over the substrate 201. Then, a masking element is formed over the semiconductor layers through a photolithography process. Subsequently, the semiconductor layers are etched through the masking element to form trenches therein. The remaining portions of the semiconductor layers become the active regions 210 that include the semiconductor layers 210A and 210B. Subsequently, a dielectric material, such as silicon oxide, is deposited into the trenches. A chemical mechanical planarization (CMP) process may be performed to planarize a top surface of the device 200. Thereafter, the dielectric material is recessed to form the isolation structure 205. In an isolation-first scheme, the operation 110 may include substantially the same or similar processes as discussed above, albeit in different orders.

Now referring to FIGS. 1 and 6A-6C, at operation 120, a dummy gate stack 215 is formed over the active regions 210 and the isolation structure 205. In the present embodiment, the dummy gate stack 215 will be removed in a later gate-replacement process. Referring to FIGS. 6A-6C, the dummy gate stack 215 engages the active regions 210 at the channel region 210C. The dummy gate stack 215 may include single or multiple layers of materials, for example, an interfacial layer (e.g., silicon oxide), a polysilicon (or poly) layer, an etch stop layer (e.g. silicon oxide, silicon nitride, silicon oxynitride), and/or a hard mask layer (e.g. silicon oxide, silicon nitride). The dummy gate stack 215 may be formed by suitable deposition processes such as chemical vapor deposition (CVD), atomic layer deposition (ALD), chemical oxidation, thermal oxidation, and/or other suitable methods.

Referring to FIGS. 1, 7A-7C, and 8A-8C, at operation 130, gate spacers 220 on sidewalls of the dummy gate stack 215. Referring to FIGS. 7A-7C, a spacer layer 220 is deposited over the device 200. The spacer layer 220 may include one or more dielectric materials such as silicon oxide (SiO), silicon nitride (SiN), silicon oxynitride (SiON), silicon oxycarbon nitride (SiOCN), low-k dielectric material (k<3.5), other dielectric materials, or a combination thereof. The spacer layer 220 may include a single layer or a multilayer structure. In the present embodiment, the spacer layer 220 has a thickness of few nanometers. The spacer layer 220 may be formed by chemical oxidation, thermal oxidation, ALD, CVD, and/or other suitable methods. Referring to FIGS. 8A-8C, the spacer layer 220 is etched by an anisotropic etching process to remove portions of the spacer layer 220 from a top surface of the dummy gate stack 215 and from top and sidewall surfaces of the active regions 210. Portions of the spacer layer 220 on the sidewall surfaces of the dummy gate stack 215 substantially remain and become the gate spacers 220. In an embodiment, the anisotropic etching process is a dry (e.g., plasma) etching process.

Referring to FIGS. 2 and 9A-9C, at operation 140, portion of the active regions 210 in the S/D regions 210S/D are removed to form the S/D trenches 910 therein. In some embodiments, S/D portions of active regions 210 are removed by an etching process along sidewalls of the gate spacers 220 without etching or substantially etching channel regions of the active regions 210. The etching process may include a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. A lithography process may provide a masking element defining the etching region. After the etching process, termination ends 210AT of the semiconductor layers 210A and termination ends 210BT of the semiconductor layers 210B are exposed in the S/D trenches.

Still at operation 140, in some embodiments, the Si layer 210A may be intentionally doped to form transistor features, e.g., the source/drain. In some other embodiments, instead of doping the Si layers 210A at operation 140, the Si layer 210A may be intentionally doped during the contact etch process, which will be described later referring to operation 180 and FIGS. 16A-16C. A portion of the Si layer 210A (e.g., 210S/D) may be doped with a p-type dopant such as boron (for example, $^{11}B$, $BF_2$), aluminum (Al), indium (In), and gallium (Ga), or an n-type dopant such as phosphorus (for example, $^{31}P$), arsenic (As), antimony (Sb). In some embodiments, the portions of the Si layer 210A underlying the gate spacers 220 (e.g., 210S/D) may have a greater doping concentration than the portions of the Si layer 210A underlying the dummy gate stacks 215 (e.g., 210C). For example, for a n-type transistor, the portions of the Si layer 210A underlying the gate spacers 220 may have a greater n-type doping ($^{31}P$, As, or combinations thereof) than the portions of the Si layer 210A underlying the dummy gate stacks 215. And, for a p-type transistor, the portions of the Si layer 210A underlying the gate spacers 220 may have a greater p-type doping (e.g., $^{11}B$, $BF_2$, or other p-type dopant) than the portions of the Si layer 210A underlying the dummy gate stacks 215. In some other embodiments, the portions of the Si Layer 210A underlying the gate spacers 220 may include different dopant than that of the portions of the Si layer 210 underlying the dummy gate stacks 215. For example, the portions of the Si layer 210A underlying the dummy gate stacks 215 include an n-type dopant ($^{31}P$, As, other n-type dopant, or combinations thereof), the portions of the Si layer 210A underlying the gate spacers 220 may have a p-type dopant (e.g. $^{11}B$, $BF_2$, other p-type dopant, or combinations thereof). Or, the portions of the Si layer 210A underlying the dummy gate stacks 215 comprise a p-type dopant (e.g. $^{11}B$, $BF_2$, other p-type dopant, or combinations thereof), the portions of the Si layer 210A underlying the gate spacers 220 may have a n-type dopant ($^{31}P$, As, other n-type dopant, or combinations thereof). In the embodiments that the portions of the Si Layer 210A underlying the gate spacers 220 include different dopant than the portions of the Si layer 210 underlying the dummy gate stacks 215, the Si Layer 210A underlying the gate spacers 220 may also include the same dopant as the portions of the Si layer 210 underlying the dummy gate stacks 215. For example, the portions of the Si layer 210A underlying the dummy gate stacks 215 is doped with a n-type dopant, the portions of the Si layer 210A underlying the gate spacers 220 may be doped with a p-type dopant and a n-type dopant. Or, the portions of the Si layer 210A underlying the dummy gate stacks 215 is doped with a p-type dopant, the portions of the Si layer 210A underlying the gate spacers 220 may be doped with a n-type dopant and a p-type dopant. In an embodiment, the 210A underlying the gate structure (i.e. 210C) is not doped, while the 210A underlying the gate spacers 220 (i.e. 210S/D) is doped to form the transistor source/drain. In some embodiments, semiconductor layers 210A are doped by an ion implantation process. During the implantation, the implantation time and implantation angle (for example, about 5 to about 45 degrees tilt angle to the y-direction) is controlled to ensure the doping concentration according to the design requirements of device 200. In some further embodiments, annealing processes are performed to activate dopants in semiconductor layers 210A.

Referring to FIGS. 2, 10A-10C, and 11A-11C, at operation 150, inner spacers 1100 are formed along sidewalls of the second semiconductor layer 210B in the channel regions. Referring to FIGS. 10A-10C, first, portions of the semiconductor layers 210B exposed in the S/D trenches are removed by a suitable etching process to form recessed semiconductor layers 210B between semiconductor layers 210A, such that portions (edges) of semiconductor layers 210A are suspended in the S/D trenches 910. In some embodiments, the etching process at operation 150 selectively removes potions of layers 210B from the terminations ends 210BT without removing or substantially removing layers 210A due to the different etching/oxidation selectivity of the materials of the semiconductor layers 210A (e.g. Si) and 210B (e.g. SiGe). In an embodiment where semiconductor layers 210A comprise Si and semiconductor layers 210B comprise SiGe, the selective removal of the SiGe layers may include a SiGe oxidation process followed by a SiGeOx removal. In some embodiments, the etching process is a selective isotropic etching process (e.g., a selective dry etching process or a selective wet etching process), and the extent of which semiconductor material 210B is removed is controlled by duration of the etching process. In some embodiments, the selective wet etching process may include a hydro fluoride (HF) or NH4OH etchant. After the selective etching, the termination ends 210BT of the semiconductor layers 210B are recessed compared with the termination ends 210AT of the semiconductor layers 210A.

Then, referring to FIGS. 11A-11C, still at operation 150, inner spacers 1100 are formed around the recessed semiconductor layers 210B (around the recessed termination ends 210BT of the semiconductor layers 210B). In various embodiments, inner spacers 1110 may comprise same or different materials from the spacers 220. In the depicted embodiment, inner spacers 1100 comprise the same materials as gate spacers 220, for example, SiO, SiN, SiON, SiOCN, low-k dielectric materials (k<3.5), or a combination thereof. The inner spacers 1100 may be formed by depositing an inner spacer layer in the S/D trench, and then etching the inner spacer layer along sidewalls of the spacers 220, until the termination ends 210AT of the first semiconductor layers 210A are exposed in the S/D trench. The inner spacer layer may be formed by ALD, CVD, PVD, and/or other suitable methods. The etching may comprise a dry etching, a wet etching, or a combination thereof. The inner spacers 1100 and the gate spacers 220 are collectively referred to as spacers.

Now referring to FIGS. 2 and 12A-12C, at operation 160, a dielectric layer, such illustrated by an interlayer dielectric (ILD) layer 225, is formed over the substrate 201 and the isolation structure 205. The ILD layer 225 may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The ILD layer 225 may be deposited by a PECVD process, a flowable CVD (FCVD) process, or other suitable deposition technique. In an embodiment, after the ILD layer 225 are deposited, a CMP process is performed to planarize a top surface of the device 200. As a result, the dummy gate stack 215 is exposed from a top surface of the device 200. The dielectric layer formed may include multiple layers.

Now referring to FIGS. 2, 13A-13C, 14A-14C, and 15A-15C, at operation 170, the dummy gate stack 215 is replaced by a metal gate stack 250. Referring to FIGS. 13A-13C, the dummy gate stack 215 is removed to expose the channel region 210C of the active regions 210. The dummy gate stack 215 is removed to form an opening 245. The channel region 210C is exposed in the opening 245. In an embodiment, the operation 170 includes one or more etching processes, such as wet etching, dry etching, or other etching techniques.

Figure 14C:
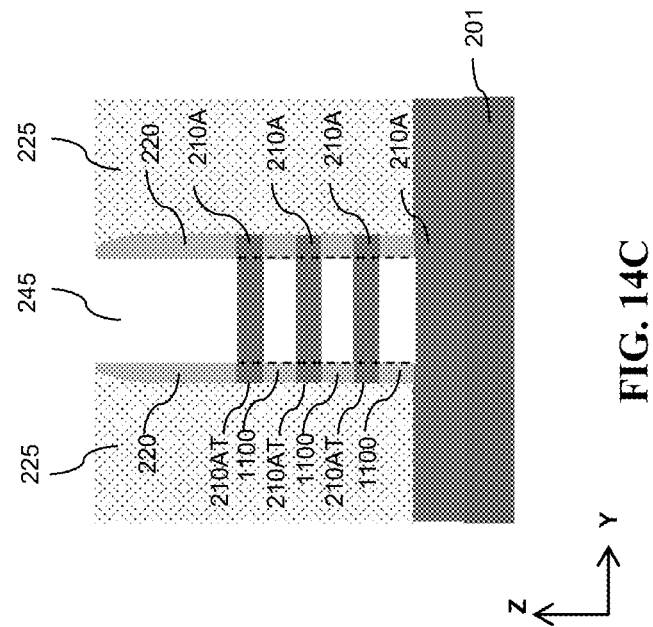
Figure 14A:
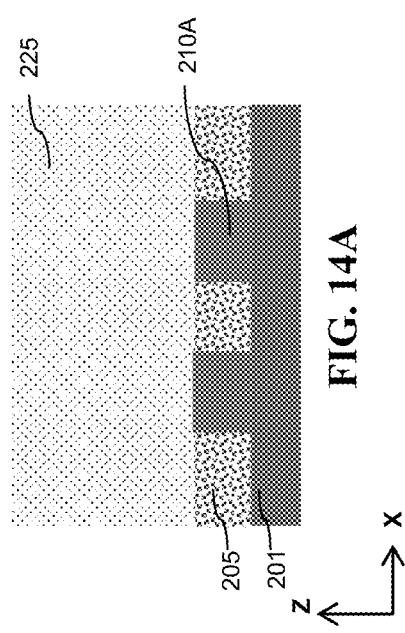
Figure 14B:
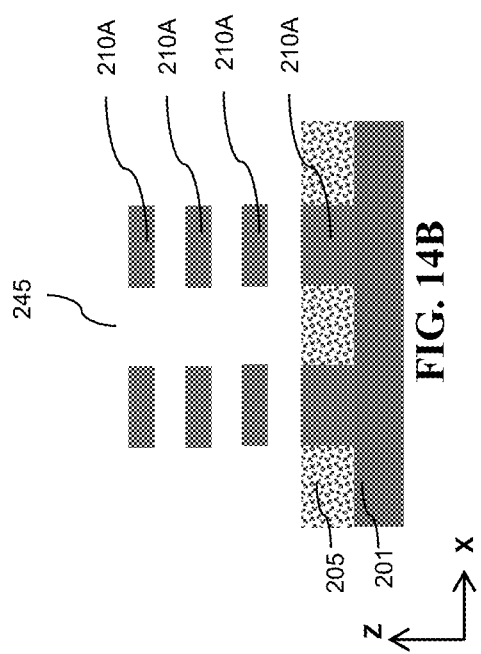

Referring to FIGS. 14A-14C, the semiconductor layers 210B are removed through the opening 245, remained semiconductor layers 210A form a nanostructure of the device 200. In some embodiments, the semiconductor layers 210B, or portions thereof, in the channel region 210C are removed. As a result, portions of the semiconductor layers 210A in the channel region 210C are suspended in the opening 245. In the following discussion, the portions of the semiconductor layers 210A suspended in the opening 245 are also referred to as the channel semiconductor layers 210A. The channel semiconductor layers 210A are slightly etched (or not) to form a nanowire structure, a nanosheet structure, or other nanostructures. In an embodiment, the selective removal of the semiconductor layers 210B by the operation 170 may use the same technique(s) discussed above with reference to the operation 150. In an embodiment, the remaining portions of the semiconductor layer 210B are oxidized to become an oxidation layer for isolation purposes. The oxidation layers are then selectively removed by a selective isotropic etching process (e.g., a selective dry etching process or a selective wet etching process).

Referring to FIGS. 15A-15C, a metal gate stack 250 is formed over the channel region 210C of the active regions 210. The metal gate stack 250 fills the opening 245 and wraps around each of the channel semiconductor layers 210A. In the present embodiment, the metal gate stack 250 includes a gate dielectric layer 252 which may consist of one or multiple layers of dielectric materials and directly wrapping over each of the channel semiconductor layers 210A. The metal gate stack 250 further includes a gate electrode 255 which may consist of one or multiple layers over the dielectric layer 252. As shown in FIG. 15B and 15C, the dielectric layer 252 and the gate electrode 255 wrap around each of the channel semiconductor layers 210A to form transistor channels thereof. In an embodiment, the dielectric layer 252 may include a high-k dielectric material such as hafnium oxide, zirconium oxide, lanthanum oxide, titanium oxide, yttrium oxide, strontium titanite, other suitable metal-oxides, or combinations thereof; and may be formed by ALD and/or other suitable methods. In an embodiment, the gate electrode 255 may include a work function metal layer. The work function metal layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by CVD, PVD, and/or other suitable process. In an embodiment, the gate electrode 255 also includes a metal fill layer, which may include aluminum, tungsten, cobalt, copper, and/or other suitable materials, and may be formed by CVD, PVD, plating, and/or other suitable processes. In some embodiments, the gate electrode 255 may also include one or more other layers such as a barrier layer, a glue layer, and/or a hard mask layer. In an embodiment, after the various layers of the metal gate stacks 250 are deposited, a CMP process is performed to planarize a top surface of the device 200.

In some embodiments, the dummy gate stacks 215 between different regions/features of device 200 (for example, in place of the dielectric dummy gate stacks 235 in FIGS. 3 and 17) are also removed to form trenches therein. Dielectric material may then be disposed in the trenches to form the dielectric dummy gate stacks 235 to isolate different regions/features of device 200.

Figure 16C:
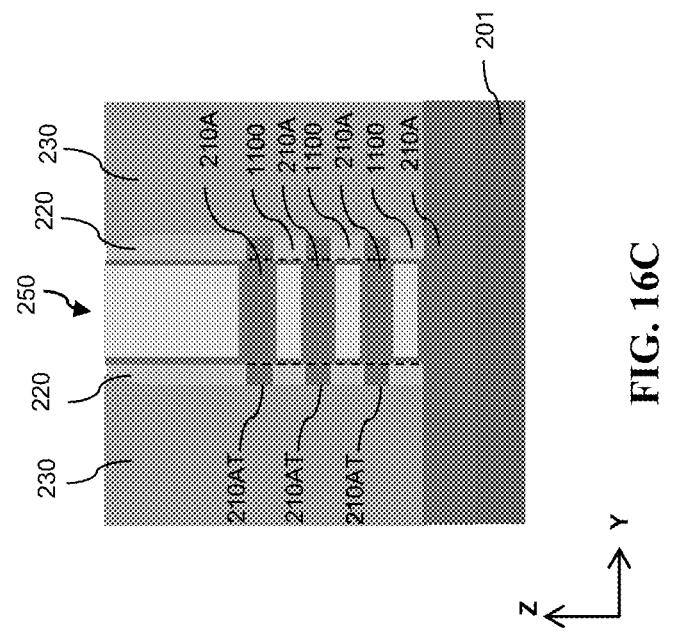
Figure 16A:
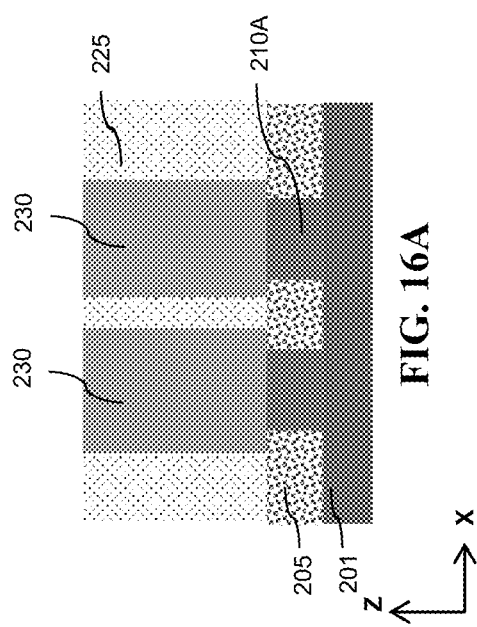
Figure 16B:
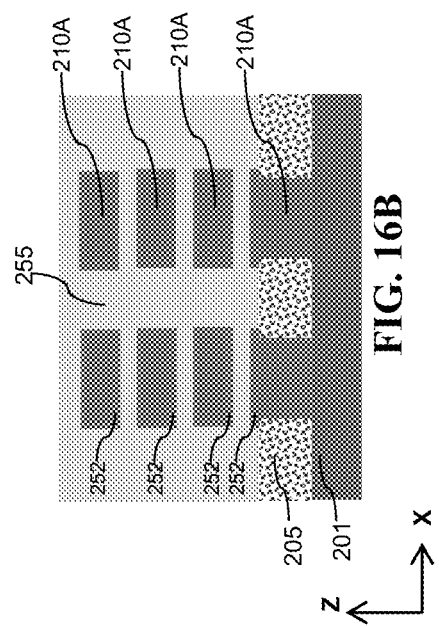
Figure 17:
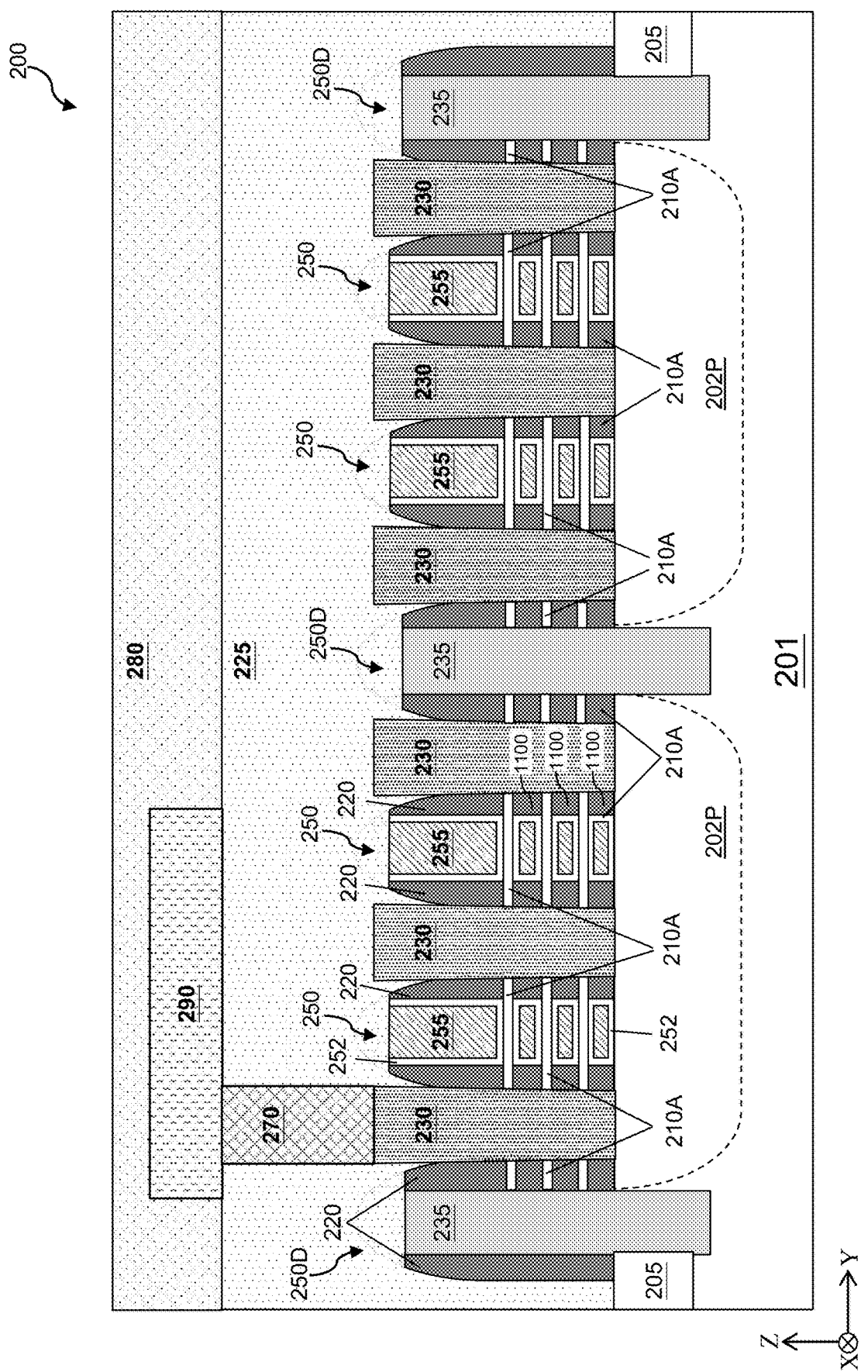
FIGS. 17 and 18 are cross-sectional views along plane D-D shown in FIG. 3 of the example semiconductor device at intermediate stage of the method of FIGS. 1 and 2 according to various embodiments of the present disclosure.

Now referring to FIGS. 2 and 16A-16C, at operation 180, S/D contacts 230 (i.e. metal plugs) are formed to the S/D regions 210S/D of the active regions 210. First, the ILD layer 225 are patterned and portions are removed by an etching process, for example, a dry etching, a wet etching, or combinations thereof to form a contact hole. In some embodiments, each of the contact hole has a rectangular shape in the x-y plane. In a further embodiment, a length of the contact hole in the x-direction (e.g., along the direction of the gate structure) is at least about 1.5 times of the width of the contact hole in the y-direction. Subsequently, in some embodiments, instead of or in addition to doping the Si layers 210A at operation 140 (FIGS. 9A-9C) as discussed above, the Si layers 210A may be intentionally doped to form the source/drain of device 200 at operation 180. For example, after the contact hole is formed, the termination ends 210AT of the Si layer 210A are exposed in the contact hole. An ion implantation may be performed to dope the portions of the Si layer 210A underlying the spacers (including the gate spacers 220 and inner spacers 1100) with a p-type dopant such as boron (for example, $^{11}$B, $BF_2$), aluminum (Al), indium (In), and gallium (Ga), or an n-type dopant such as phosphorus (for example, $^{31}$P), arsenic (As), antimony (Sb) depending on the transistor type of device 200. Implantation angle and time can be controlled to achieve the required doping concentration. Thereafter, the S/D contacts 230 including one or more conductive materials are formed in the contact hole. In an embodiment, each of the S/D contacts 230 has a rectangular shape in the x-y plane. In a further embodiment, a length of the S/D contact 230 in the x-direction is at least about 1.5 times of the width of the S/D contact in the y-direction. The conductive material(s) forming the S/D contacts 230 may include tantalum (Ta), titanium (Ti), aluminum (Al), copper (Cu), cobalt (Co), tungsten (W), titanium nitride (TiN), tantalum nitride (TaN), other suitable conductive materials, or combinations thereof. In some embodiment, the conductive material of the S/D contacts 230 can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the S/D contacts 230. As illustrated in FIG. 16C, the contact 230 directly interfaces 210AT.

Now referring to FIGS. 2 and 17, at operation 190, further processing is performed to complete the fabrication of device 200. FIG. 17 provides a cross-sectional view along plane D-D shown in FIG. 3 of the device 200 (i.e. a cross-section view of device 200 corresponding to FIG. 16C). As illustrated in FIG. 17, various vias 270, wires 290, and other multilayer interconnect features (e.g., interlayer dielectrics 280) over the substrate 201 are formed. These multilayer interconnect features configured to connect the various features to form a functional circuit that may include one or more multi-gate devices.

In a conventional GAA device, the S/D features may be epitaxially grown in the S/D regions interfacing dielectric regions such as the inner spacers, which may create regions of poor quality, the S/D parasitic resistance may increase, and/or the on-current may be reduced. However, in the present disclosure, including as illustrated in FIGS. 16C and 17, termination ends 210AT provide the source/drain regions of the semiconductor layers 210A, and thus, epitaxially grown source/drain features may be omitted. As illustrated, the termination ends of each semiconductor layers 210A are wrapped by the spacers (for example, termination ends of the topmost semiconductor layer 210A are wrapped by the gate spacers 220 and the inner spacers 1100, and termination ends of the lower semiconductor layers 210A are wrapped by the inner spacers 1100). Each S/D contact directly contacts each of the semiconductor layers 210A at the termination ends 210AT, providing contact to the source/drain region of the GAA transistor. Thus, in some embodiments, no S/D features are epitaxially grown in the S/D regions 210S/D of the active regions 210. This may mitigate the issues caused by the poor S/D features grown in the S/D regions. For example, reduce the S/D parasitic resistance, increase the on-current, and thereby, improve the performance of the semiconductor device. In this embodiment, the processing step of epitaxially growing of the S/D features can be skipped, thereby to simplify the fabrication process and reduce the fabrication cost.

Figure 18:
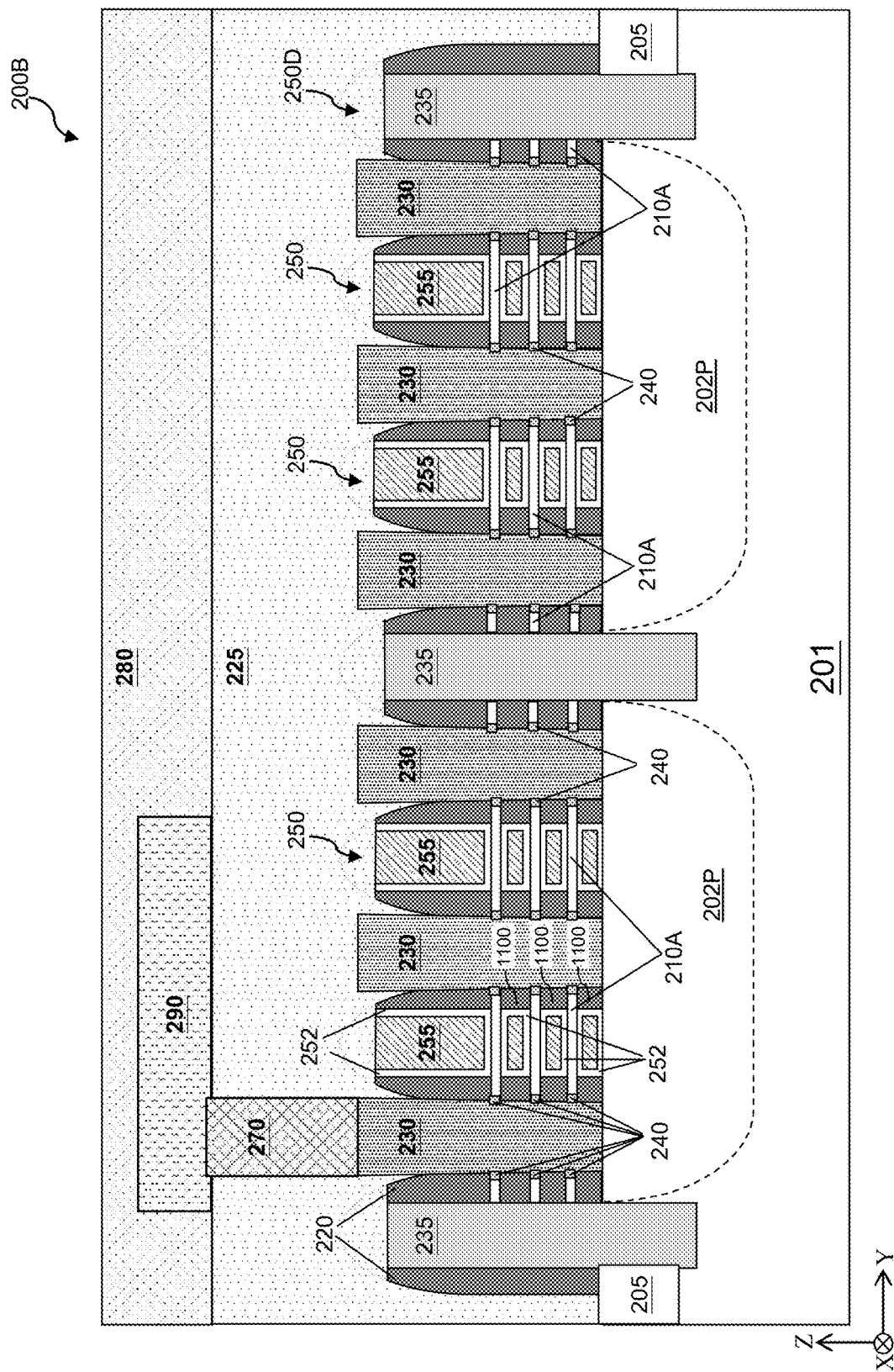

In another embodiment, as illustrated in FIG. 18, a device 200B, which is another embodiment of device 200, is illustrated. Device 200B includes substantially the same features as discussed above in device 200, and may be formed in the same manner, with additional silicide features as described herein. The device 200B is illustrated having silicide structures 240 formed between the S/D contacts 230 and the source/drain regions formed at the ends of semiconductor layers 210A to further reduce the S/D parasitic resistance. In some embodiments, S/D contact may also be referred to a combined structure of the metal plug 230 and the silicide structure 240. In some embodiments, an annealing process is performed to form the silicide structures 240 between the metal plugs of the S/D contacts 230 and the semiconductor layers 210A. For example, device 200 may be heated to cause constituents of the termination ends of the semiconductor layers 210A to react with the metal plug 230. Silicide structures 240 thus include metal and a constituent of the semiconductor layers (for example, Si). In some embodiments, silicide structures 240 include Titanium Silicide (TiSi, TiSi2), Nickel Silicide (NiSi), Platinum Silicide (PtSi, PtSi2), Cobalt Silicide (CoSi, CoSi2), Molybdenum Silicide (MoSi), Titanium Platinum Silicide (TiPtSi), Nickle Platinum Silicide (NiPtSi), other suitable metal, or combinations thereof. In some other embodiments, silicide structures 240 may be formed before forming the metal plugs 230. For example, a metal layer may be deposited in the S/D regions. The metal layers are then heated to react with the channel semiconductor layers. Subsequently, any unreacted metal materials are removed (e.g. by etching), and the remained reacted materials form the silicide structures 240. Thereafter, the metal plugs 230 are deposited in the S/D regions. With the silicide structures 240 formed between the metal plug 230 and the semiconductor layers 210A, the S/D parasitic resistance can be further reduced.

Figure 19:
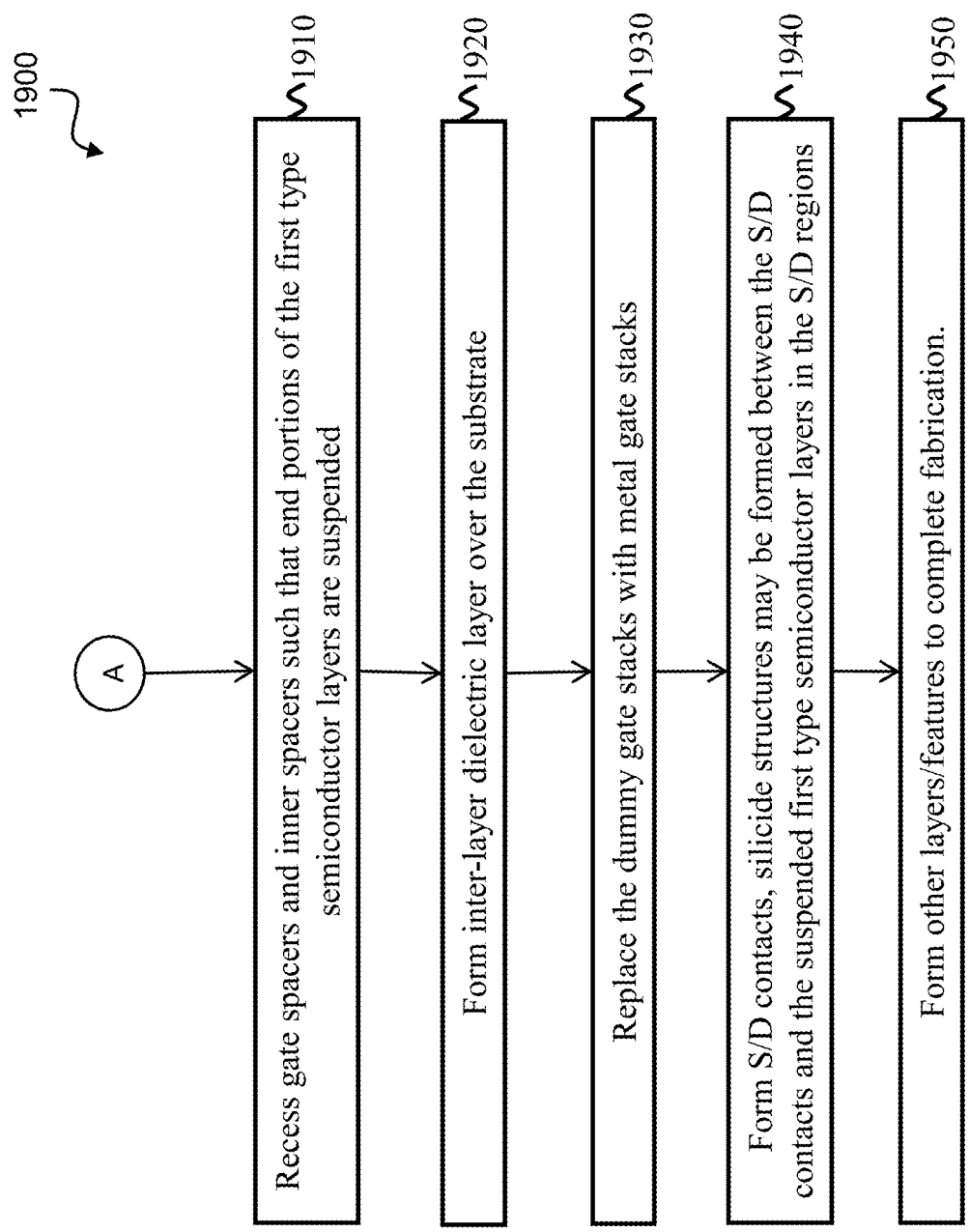
FIG. 19, combined with FIG. 1, is a flowchart of another example method forming a semiconductor device, according to various embodiments of the present disclosure.

Referring now to another of the methods provided for forming GAA transistors, FIG. 19 provides a flowchart of another method 1900 for forming the exemplary device 200C, which is an embodiment of the device 200, in accordance with some other embodiments of the present disclosure. The method 1900 and device 200C includes many of the same features as discussed above, which similarly apply to the present method and device. Differences, including the configuration of the S/D regions of the semiconductor layers (e.g., 210) noted. Method 1900 is merely an example and is not intended to limit the present disclosure beyond what is explicitly recited in the claims. Additional operations can be performed before, during, and after method 1900, and some operations described can be replaced, eliminated, or moved around for additional embodiments of the method.

Figure 27:
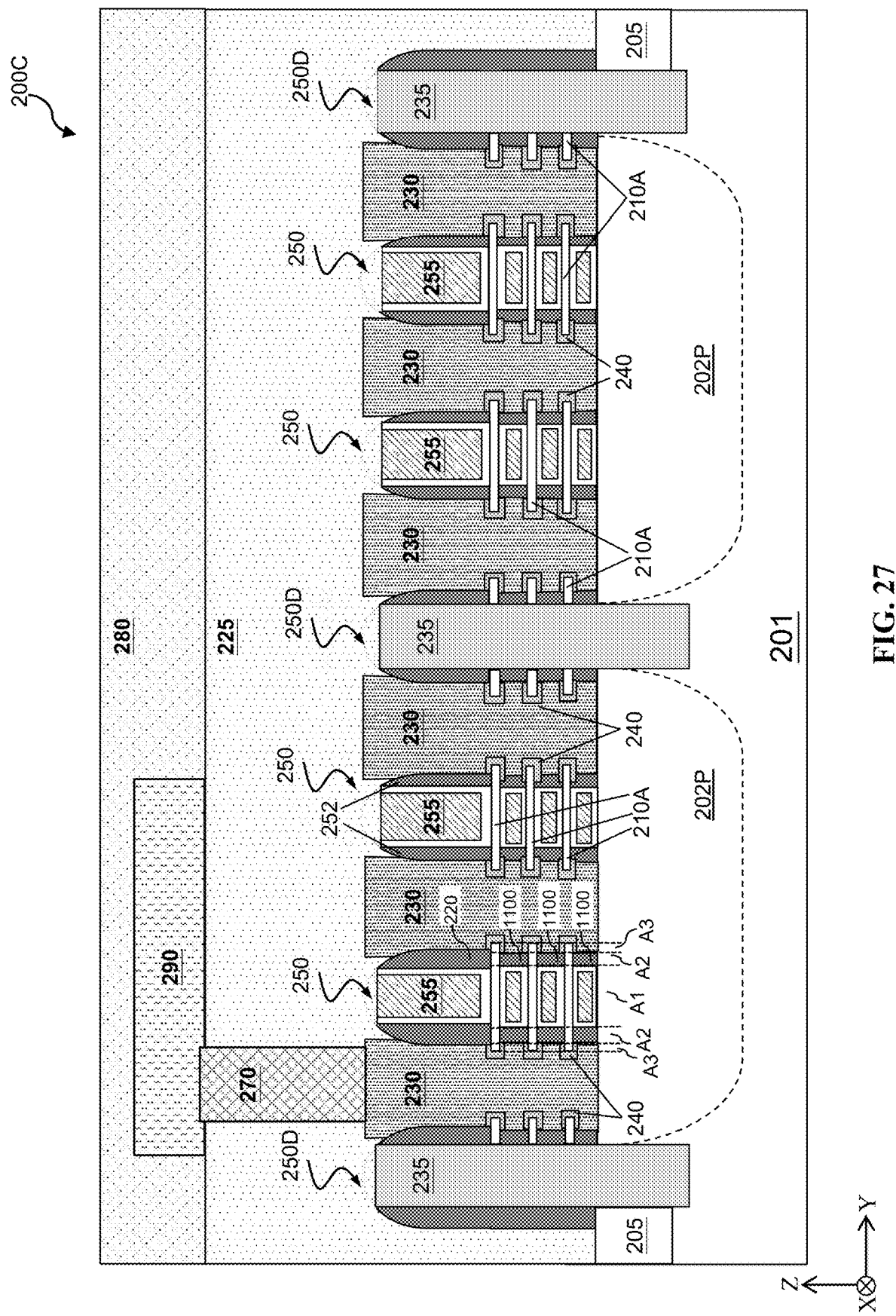
FIGS. 27 and 28 are cross-sectional views along plane D-D shown in FIG. 3 of the example semiconductor device at intermediate stage of the method of FIGS. 1 and 19 according to various embodiments of the present disclosure.

Method 1900 is described below in conjunction with FIGS. 20A-26A, 20B-26B, 20C-26C, and 27as well as FIGS. 1, 3, 4, 5A-11A, 5B-11B, and 5C-11C, which illustrate various top views, three-dimensional views, and cross-sectional views of device 200C during intermediate steps of method 1900. In particular, FIGS. 20A-26A illustrate cross-sectional views of block E-E of device 200C taken along plane A-A in FIG. 4 (that is, along an x-direction). FIGS. 20B-26B illustrate cross-sectional views of block E-E of device 200C taken along plane B-B in FIG. 4 (that is, also along the x-direction); and FIGS. 20C-26C illustrate cross-sectional views of block E-E of device 200C taken along plane C-C in FIG. 4 (that is, along a y-direction). FIG. 27 is a cross-sectional view of an embodiment of device 200C taken along plane D-D shown in FIG. 3 at intermediate stage of the method 1900 according to various embodiments of the present disclosure.

Method 1900 comprises similar operations 110-150 as illustrated in FIGS. 1 and 5A-11A, 5B-11B, and 5C-11C. After operation 150, as illustrated in FIGS. 20A-20C, device 200C includes the same structures as FIGS. 11A-11C, except that the spacers (including the gate spacers 220 and inner spacers 1100) have larger thickness T in the y-direction compare with that of device 200 in FIGS. 11A-11C. Method 1900 then moves to the next operation 1910.

Referring to FIGS. 19 and 21A-21C, at operation 1910, portions of inner spacers 1100 and portions of gate spacers 220 are recessed in the y-direction by a suitable etching process, for example, a (selective) dry etching, a wet etching, or combinations thereof. A time of etching may be controlled such that a proper extent of etching may be achieved. Thereby, as illustrated in FIG. 21C, the semiconductor layers 210A includes three portions after the recessing of the spacers, i.e. A1, A2, and A3. Portions A1 are underlying the dummy gate stack 215 and form the channel region 210C. Portions A2 are underlying the spacers (including the gate spacers 220 and inner spacers 1100). Portions A3 extend outside of the spacers and become suspended. Portions A2 and A3 together form the S/D regions 210S/D. In some embodiments, the operation 1910 may further include providing a suitable dopant to form the source/drain regions of the transistor as discussed above referring to operation 140 and FIGS. 9A-9C. Thus, in the following discussion, the portions of the semiconductor layers 210A suspended in the S/D regions 210S/D are also referred to as the S/D semiconductor layers 210A.

Referring to FIGS. 19 and 22A-22C, at operation 1920, dielectric layer or layers, referred to as interlayer dielectric (ILD) layer 225, is formed over the substrate 201 and the isolation structure 205. As depicted in FIGS. 22A and 22C, the ILD layer 225 wraps the suspended portions (i.e. A3) of the S/D semiconductor layers 210A. The material and the fabrication process of the ILD layer 225 is similar as those discussed referring to FIGS. 12A-12C (operation 160). In an embodiment, after the ILD layer 225 are deposited, a CMP process is performed to planarize a top surface of the device 200C. As a result, the dummy gate stack 215 is exposed from a top surface of the device 200C.

Now referring to FIGS. 19, 23A-23C, 24A-24C, and 25A-25C, at operation 1930, the dummy gate stack 215 is replaced by a metal gate stack 250. The metal gate replacing process is similar as those illustrated in FIGS. 13A-13C, 14A-14C, and 15A-15C. For example, referring to FIGS. 23A-23C, the dummy gate stack 215 is removed, for example by an etching process, to expose the channel region 210C. As depicted in FIG. 23B, the semiconductor layers 210A and 210B in the channel region 210C are exposed in the opening 245.

Referring to FIGS. 24A-24C, the semiconductor layers 210B are selectively removed through the opening 245. The remained semiconductor layers 210A form a nanostructure (e.g. nanowire or nanosheet) of device 200C. As a result, portions of the semiconductor layers 210A in the channel region 210C (i.e. portions A1) are suspended in the opening 245. The semiconductor layers 210A suspended in the channel region 210C are also referred to as the channel semiconductor layers 210A. The selective removal of the semiconductor layers 210B may use the same technique(s) as discussed above, e.g. a selective oxidation process followed by a selective isotropic etching process.

Referring to FIGS. 25A-25C, a metal gate stack 250 is formed over the channel region 210C of the active regions 210. The metal gate stack 250 fills the opening 245 and wraps around each of the channel semiconductor layers 210A. Similar as discussed in FIGS. 15A-15C, the metal gate stack 250 includes a dielectric layer 252 which may consist of one or multiple layers of dielectric materials and directly wrapping over each of the channel semiconductor layers 210A (i.e. portions A1). The metal gate stack 250 further includes a gate electrode 255 which may consist of one or multiple layers over the dielectric layer 252. As shown in FIG. 25B and 25C, the dielectric layer 252 and the gate electrode 255 wrap around each of the channel semiconductor layers 210A (i.e. portions A1) to form transistor channels thereof. The materials and the fabrication process of the metal gate stack 250 are similar as those discussed with regard to FIGS. 15A-15C.

In some embodiments, the dielectric dummy gate stacks 235 are formed before or after the metal gate replacement process to isolate different regions/features of device 200C.

Now referring to FIGS. 19 and 26A-26C, at operation 1940, S/D contacts (metal plugs 230 with or without silicide structures 240) are formed to the S/D regions 210S/D of device 200C. In other words, the S/D contacts (metal plugs and/or silicide structures 204) physical interface the portion of the semiconductor layer 210A that has been suitably doped to form the source or drain of the GAA transistor. The formation of the S/D contacts includes several steps. In some embodiments, for example, first, the ILD layer 225 are covered by a patterned photoresist mask and portions of the ILD layer 225 exposed through the mask are removed by an etching (dry etching, a wet etching, or combinations thereof) process to form contact holes therein. Subsequently, in some embodiments, instead of doping the Si layers 210A at operation 140 (FIGS. 9A-9C) or at operation 1910 (FIGS. 21A-21C), the Si layers 210A may be intentionally doped to form the source/drain of device 200 at operation 1940. Similarly as discussed regarding FIGS. 16A-16C, after the contact hole is formed, an ion implantation may be performed to dope the S/D portions (i.e. A2 and A3) of the Si layer 210A with a p-type dopant or an n-type dopant depending on the transistor type of device 200C. Implantation angle and time can be controlled to achieve the required doping concentration. Thereafter, the metal plugs 230 of the S/D contacts including one or more conductive materials are formed in the contact holes. In some embodiments, each of the metal plug has a rectangular shape in the x-y plane. In a further embodiment, a length of the S/D contact in the x-direction is at least about 1.5 times of the width of the S/D contact in the y-direction. The materials and the deposition process of the metal plugs 230 are similar as those discussed above regarding FIGS. 16A-16C. Thereafter, an annealing process is performed to device 200C, such that the silicide structures 240 are formed between the metal plugs 230 and the suspended A3 portions of S/D semiconductor layers 210A. As illustrated in FIG. 26C, the silicide structures 240 surrounded the suspended A3 portions of the semiconductor layers 210A. Similar as discussed above, in some other embodiments, the silicide structures 240 may be formed before the deposition of the metal plugs 230. The silicide structures 240 are optional. In some other embodiments, the metal plugs 230 directly contact and wrap the S/D semiconductor layers 210A without the silicide structures 240 formed therebetween.

Now referring to FIGS. 19 and 27, at operation 1960, further processing is performed to complete the fabrication of device 200C. FIG. 27 provides a cross-sectional view of the embodiment of device 200C along plane D-D shown in FIG. 3 of the device 200C (i.e. a cross-section view of device 200C corresponding to FIGS. 26C). As illustrated in FIG. 27, various vias 270, wires 290, and other multilayer interconnect features (e.g., interlayer dielectrics 280) over the substrate 201 are formed. These multilayer interconnect features configured to connect the various features to form a functional circuit that may include one or more multi-gate devices.

In the present disclosure, as illustrated in the embodiment of device 200C of FIG. 27, each of the semiconductor layers 210A comprises three portions A1, A2, and A3. The first portions A1 of semiconductor layers 210A are wrapped by the metal gate stacks 250 and form the channels of the device 200D (the channel semiconductor layers); the second portions A2 are wrapped by the spacers (for example, portions A2 of the topmost semiconductor layer 210A are wrapped by the gate spacers 220 and the inner spacers 1100, and portions A2 of the lower semiconductor layers 210A are wrapped by the inner spacers 1100); and the third portions A3 extending through the spacers and interfacing the S/D contacts. In some embodiments, the S/D contacts comprise metal plugs 230. In some other embodiments, the S/D contacts not only comprise metal plugs 230, but also the silicide structures 240 formed between the metal plugs 230 and the third portions A3 of the semiconductor layers 210A. In the depicted embodiment of FIG. 27, no S/D features are epitaxially grown in the S/D regions. S/D contacts directly interface the third portion A3 of the semiconductor layers 210A, thereby they can reduce the parasitic resistance of the S/D contact and increase the on-current of the device 200C. With the silicide structures 240 formed between the metal plug 230 and the channel semiconductor layers 210A, the S/D parasitic resistance can be further reduced.

Figure 28:
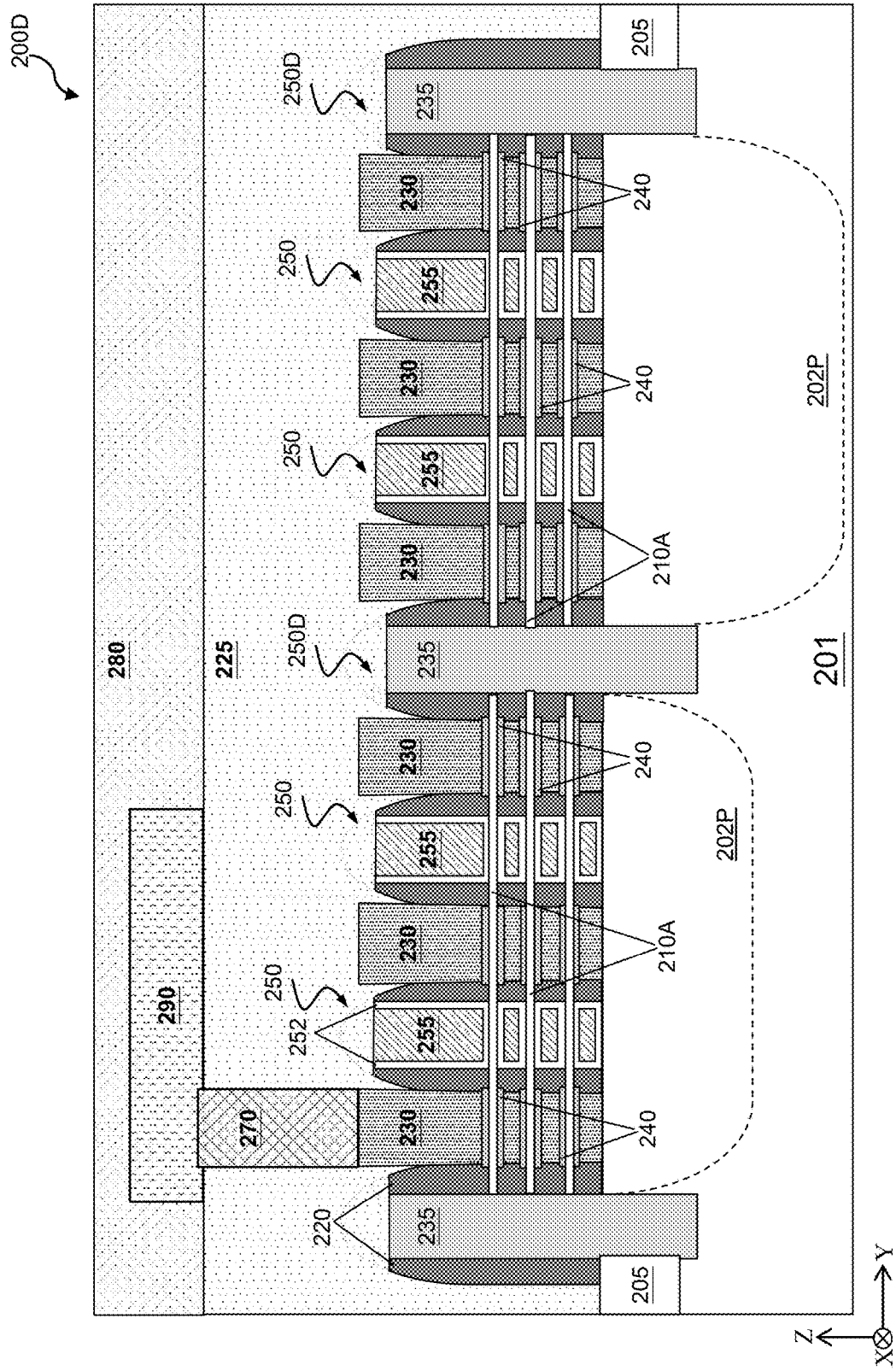

In some other embodiments, S/D semiconductor layers 210A may contiguously extend from under one gate structure to under an adjacent (e.g., be connected in the S/D regions, for example, as depicted in FIG. 28). The device 200D is an embodiment of the device 200 discussed above and includes many of the same features and can be fabricated in substantially similar manner with differences noted here. For example, in the embodiment of device 200D of FIG. 28, GAA device 200D comprises S/D semiconductor layers 210A connected in the S/D regions. The S/D contacts (metal plug 230 with or without silicide structure 240) directly contacts and wraps the connected S/D semiconductor layers 210A in the S/D regions. No S/D features need be epitaxially grown in the S/D regions 210S/D. This may reduce the S/D parasitic resistance, increase the on-current, and thereby, improve the performance of the semiconductor device. In this embodiment, the processing step of epitaxially growing of the S/D features can be skipped, thereby to simplify the fabrication process and reduce the fabrication cost.

Figure 29:
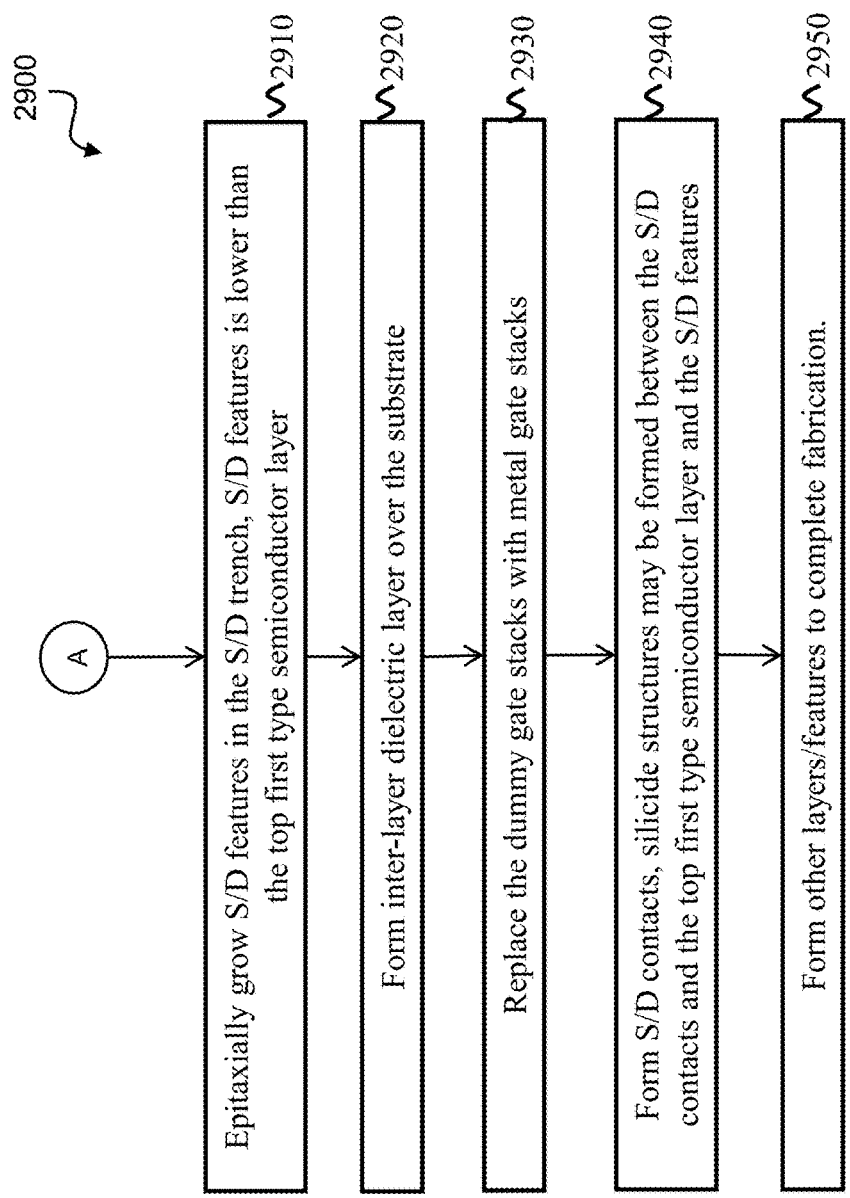
FIG. 29, combined with FIG. 1, is a flowchart of yet another example method forming a semiconductor device, according to various embodiments of the present disclosure.

FIG. 29 provides a flowchart of yet another method 2900 for forming in an embodiment the exemplary device 200E, which is an embodiment of the device 200, in accordance with yet some other embodiments of the present disclosure. Method 2900 is merely an example and is not intended to limit the present disclosure beyond what is explicitly recited in the claims. Additional operations can be performed before, during, and after method 2900, and some operations described can be replaced, eliminated, or moved around for additional embodiments of the method.

Figure 36:
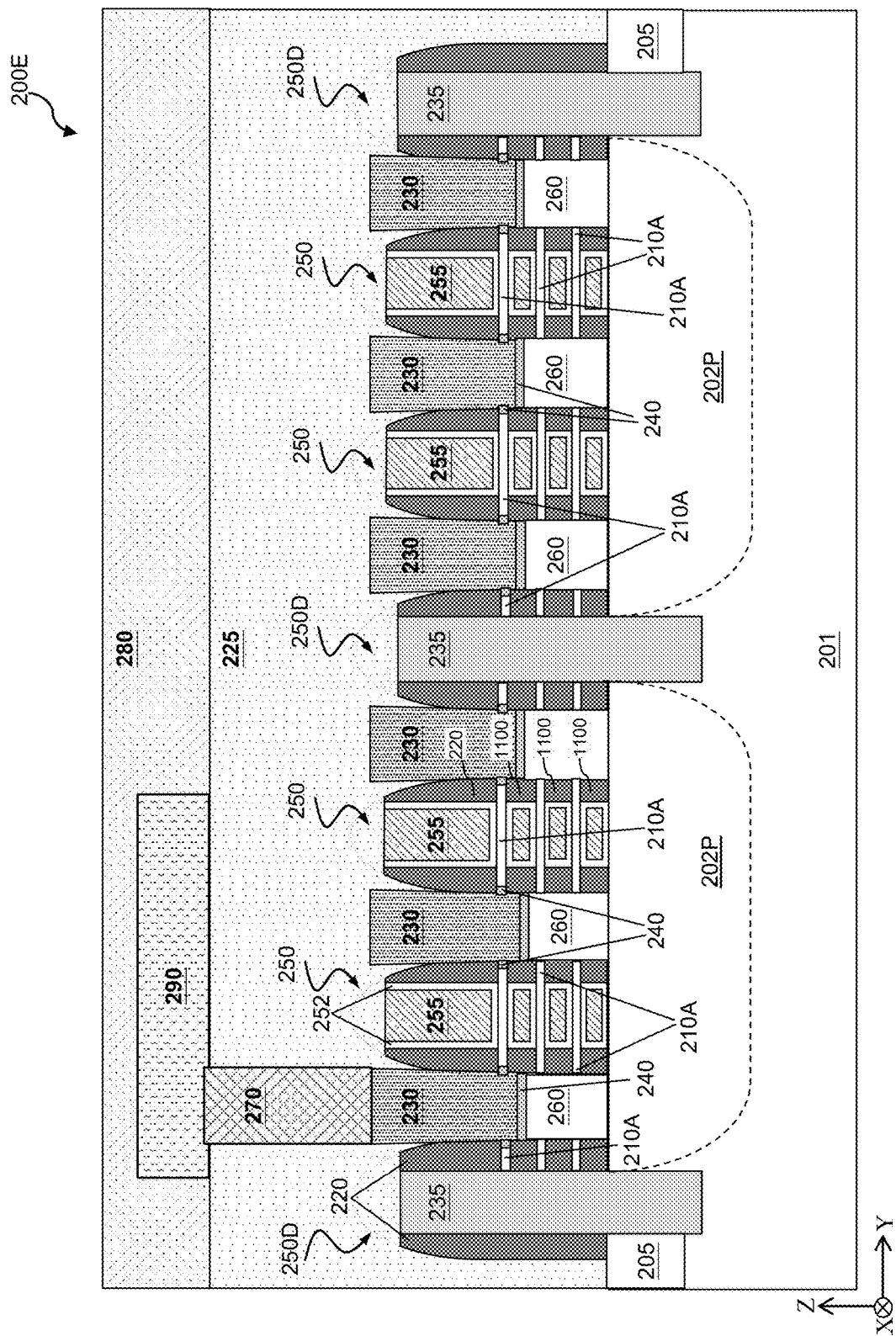
FIGS. 36 and 37 are cross-sectional views along plane D-D shown in FIG. 3 of the example semiconductor device at intermediate stage of the method of FIGS. 1 and 29 according to various embodiments of the present disclosure.

Method 2900 is described below in conjunction with FIGS. 30A-35A, 30B-35B, 30C-35C, 36, as well as FIGS. 1-4, 5A-11A, 5B-11B, and 5C-11C, which illustrate various top views, three-dimensional views, and cross-sectional views of device 200E during intermediate steps of method 2900. In particular, FIGS. 30A-35A illustrate cross-sectional views of block E-E of device 200E taken along plane A-A in FIG. 4 (that is, along an x-direction). FIGS. 30B-35B illustrate cross-sectional views of block E-E of device 200E taken along plane B-B in FIG. 4 (that is, also along the x-direction); and FIGS. 30C-35C illustrate cross-sectional views of block E-E of device 200E taken along plane C-C in FIG. 4 (that is, along a y-direction). FIG. 36 is a cross-sectional view of device 200E taken along plane D-D shown in FIG. 3 at intermediate stage of the method 2900 according to various embodiments of the present disclosure.

Method 2900 comprises similar operations 110-150 as illustrated in FIGS. 1 and 5A-11A, 5B-11B, and 5C-11C. After operation 150, method 2900 moves to the next operation 2910.

Referring to FIGS. 29 and 30A-30C, at operation 2910, S/D features 260 are epitaxially grown in the S/D regions 210S/D of device 200E. In the depicted embodiment of FIG. 30C, a top surface 260T of the S/D features 260 is lower than a bottom surface 210AB of at least the top (uppermost) semiconductor layer 210A, such that the termination ends 210AT of at least the top semiconductor layer 210A are exposed in the S/D regions 210S/D. In some embodiments, the S/D features 260 disposed in the S/D regions of different active regions 210 are separated. In some embodiments, as shown in FIG. 30A, the S/D features 260 disposed in the S/D regions of different active regions 210 may merge into a contiguous piece.

In various embodiments, the S/D features 260 may include a semiconductor material such as silicon or germanium; a compound semiconductor such as silicon germanium, silicon carbide, gallium arsenide, gallium phosphide, indium phosphide, indium arsenide, indium antimonide; an alloy semiconductor such GaAsP, AlInAs, AlGaAs, InGaAs, GaInP, and/or GaInAsP; or combinations thereof. In some embodiments, the S/D features 260 are grown by a molecular beam epitaxy (MBE) process, and/or other suitable epitaxial growth processes. The height of the S/D features 260 may be controlled by epitaxial growth time, so that in an embodiment the top surface 260T of the S/D features 260 is lower than the bottom surface 210AB of at least the top semiconductor layer 210A. In some embodiments, the S/D features 260 are in-situ or ex-situ doped with a suitable n-type dopant or p-type dopant based on the functionality of the transistor. For example, in some embodiments, for a P-type FET, the S/D features 260 can include epitaxial layers including silicon and/or germanium, where the epitaxial layers including silicon-germanium (SiGe) are doped with boron, carbon, other p-type dopant, or combinations thereof. In some embodiments, for a N-type FET, the S/D features 260 can include epitaxial layers including silicon and/or carbon, where the epitaxial layers including silicon or silicon-carbon are doped with phosphorous, arsenic, other n-type dopant, or combinations thereof In some implementations, epitaxial source/drain features 260 include materials and/or dopants that achieve desired tensile stress and/or compressive stress in the channel regions. In some implementations, epitaxial source/drain features 260 are doped during deposition by adding impurities to a source material of the epitaxy process. In some implementations, epitaxial source/drain features 260 are doped by an ion implantation process subsequent to a deposition process. In some implementations, annealing processes are performed to activate dopants in the source/drain features 260, and/or other source/drain features of device 200E, such as HDD regions and/or LDD regions.

Now referring to FIGS. 29 and 31A-31C, at operation 2920, one or more dielectric layers such as an interlayer dielectric (ILD) layer 225 is formed over the substrate 201, the isolation structure 205, and the S/D features 260. The material and the fabrication process of the ILD layer 225 are similar as those discussed above regarding FIGS. 12A-12C (operation 160). In an embodiment, after a dielectric layer (the ILD layer 225) is deposited, a CMP process is performed to planarize a top surface of the device 200E. As a result, the dummy gate stack 215 is exposed from a top surface of the device 200E.

Now referring to FIGS. 29, 32A-32C, 33A-33C, and 34A-34C, at operation 2930, the dummy gate stack 215 is replaced by a metal gate stack 250. The metal gate replacing process is similar as those illustrated in FIGS. 13A-13C, 14A-14C, and 15A-15C. For example, referring to FIGS. 32A-32C, the dummy gate stack 215 is removed, for example by an etching process, to expose the channel region 210C. As depicted in FIG. 32B, the semiconductor layers 210A and 20B in the channel region 210C are exposed in the opening 245.

Referring to FIGS. 33A-33C, the semiconductor layers 210B are selectively removed through the opening 245. The remained semiconductor layers 210A form a nanostructure (e.g. nanowire or nanosheet) of device 200E. As a result, portions of the semiconductor layers 210A in the channel region 210C are suspended in the opening 245. The semiconductor layers 210A suspended in the channel region 210C are also referred to as the channel semiconductor layers 210A. The selective removal of the semiconductor layers 210B may use the same technique(s) as discussed above, e.g. a selective oxidation process followed by a selective isotropic etching process.

Referring to FIGS. 34A-34C, a metal gate stack 250 is formed over the channel region 210C of the active regions 210. The metal gate stack 250 fills the opening 245 and wraps around each of the channel semiconductor layers 210A. Similar as discussed in FIGS. 15A-15C, the metal gate stack 250 includes a dielectric layer 252 which may consist of one or multiple layers of dielectric materials and directly wrapping over each of the channel semiconductor layers 210A. The metal gate stack 250 further includes a gate electrode 255 which may consist of one or multiple layers over the dielectric layer 252. As shown in FIG. 34B and 34C, the dielectric layer 252 and the gate electrode 255 wrap around each of the channel semiconductor layers 210A to form transistor channels thereof. The materials and the fabrication process of the metal gate stack 250 are similar as those discussed above regarding FIGS. 15A-15C.

In some embodiments, the dielectric dummy gate stacks 235 are formed before or after the metal gate replacement process to isolate different regions/features of device 200E.

Now referring to FIGS. 29 and 35A-35C, at operation 2940, S/D contacts (metal plugs 230 with or without silicide structures 240) are formed in the S/D regions 210S/D. In an embodiment, the formation of the S/D contacts includes several steps, and similar as those discussed above regarding FIGS. 16A-16C and 26A-26C. For example, first, the ILD layer 225 are patterned and portions removed by an etching process to form contact holes therein. The S/D features 260 are then exposed in the contact holes. The termination ends 210AT of at least the top (uppermost) semiconductor layer 210A are also exposed in the contact holes. In an embodiment, a plurality of semiconductor layers 210A are exposed in the contact holes, the exposed plurality being above another plurality of semiconductor layers 210A that are not exposed. Similar as discussed above, the exposed plurality of semiconductor layers 210A may be intentionally doped with p-type dopant or n-type dopant at operation 2940. Thereafter, the metal plugs 230 of the S/D contacts including one or more conductive materials are formed in the contact holes. In an embodiment, each of the metal plugs 230 has a rectangular shape in the x-y plane. In a further embodiment, a length of the S/D contact 230 in the x-direction is at least about 1.5 times the width of the S/D contact 230 in the y-direction. As depicted in FIGS. 35A and 35C, the metal plugs 230 not only contact the S/D features 260, but also the termination ends 210AT of at least one or more of the top semiconductor layers 210A. In other words, in an embodiment, the metal plugs 230 contact at least a top (uppermost) semiconductor layer 210A, and the S/D features 260 contact at least a bottom (lowermost) semiconductor layer 210A. The materials and deposition process of the metal plugs 230 are similar as those discussed above regarding FIGS. 16A-16C.

In some embodiments, an annealing process is performed on the device to form the silicide structures 240. As depicted in FIGS. 35A and 35C, in some embodiments, the silicide structures 240 include two portions. The first portion of the silicide structures 240 are formed between the metal plugs 230 and the termination ends 210AT of at least the top semiconductor layer 210A. The second portion of the silicide structures 240 are formed between the metal plugs 230 and the S/D features 260. Similar to as discussed above, in some other embodiments, the silicide structures 240 may be formed before the deposition of the metal plugs 230. It is noted that the silicide structures 240 are optional and may be omitted. In some other embodiments, the metal plugs 230 directly contact the S/D features 260 and the termination ends 210AT of at least the top semiconductor layer 210A without the silicide structures 240 formed therebetween.

Now referring to FIGS. 29 and 36, at operation 2950, further processing is performed to complete the fabrication of the embodiment of device 200 illustrated as the embodiment of device 200E, which is substantially similar to the device 200 discussed above with differences noted herein. FIG. 36 provides device 200E, which is a cross-sectional view along plane D-D shown in FIG. 3 of an embodiment of the device 200 (i.e., a cross-section view of an embodiment of the device 200E corresponding to FIGS. 35C). As illustrated in FIG. 36, various vias 270, wires (e.g., metal layers or lines) 290, and other multilayer interconnect features (e.g., interlayer dielectrics 280) over the substrate 201 are formed. These multilayer interconnect features configured to connect the various features to form a functional circuit that may include one or more multi-gate devices.

In the present disclosure, as illustrated by the embodiment of device 200E in FIG. 36, the S/D features are formed between the inner spacers 220, and the top surface of the S/D feature is lower than the bottom surface of the topmost semiconductor layer 210A. Thus, the top semiconductor layer contacts the S/D contacts and a bottom semiconductor layer contacts the S/D features, where each of these semiconductor layers in contiguous with that forming a channel of the device. As illustrated in FIG. 36, the termination ends of the topmost semiconductor layer 210A are wrapped by the gate spacers 220 and the inner spacers 1100 and the termination ends of the lower semiconductor layers 210A are wrapped by the inner spacers 1100. In some embodiments, since the S/D contacts directly contact at least a top channel semiconductor layer, the S/D parasitic resistance may be reduced, the on-current may be increased, and thereby, the performance of the semiconductor device may be improved.

Figure 37:
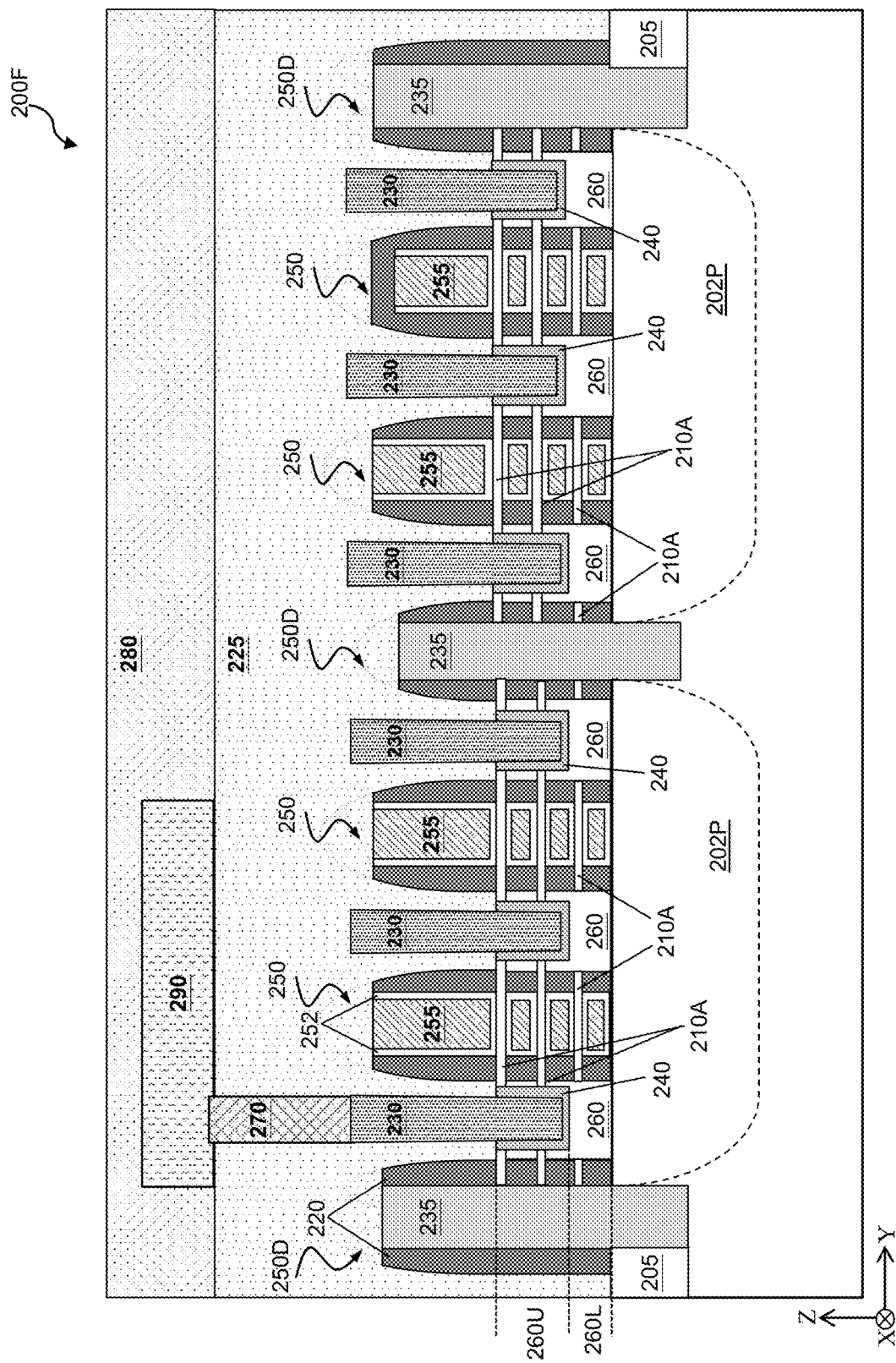

In some other embodiments, the S/D features 260 and/or the S/D contacts 230 may have other shapes. For example, as depicted in FIG. 37 and device 200F, which is an embodiment of the device 200 discussed above, the S/D features 260 are formed with a S/D feature trench therein within which the contact is formed. Each of the S/D feature 260 includes two portions, an upper portion 260U surrounds the S/D feature trench and a lower portion 260L extending below the S/D feature trench. In some embodiments, the upper portion 260U of the S/D feature wraps at least the top semiconductor layer. A termination end of at least top semiconductor layer 210A is exposed in the S/D feature trench and contacts the S/D contact (e.g., plug 230). As illustrated in FIG. 37, the upper portion 260U of the S/D feature wraps the top (uppermost) two semiconductor layers 210A and the termination ends of the top two semiconductor layers 210A are exposed in the S/D feature trench and contact the S/D contact (the metal plug 230). In some embodiments, the lower portion 260L of the S/D feature is disposed in the S/D region and is below the upper portion 260U and the trench filled by the S/D contact (e.g., plug 230). The lower portion 260L contacts the terminal ends of the bottom semiconductor layers 210A. In some embodiments, a silicide structure 240 may be formed, for example by an annealing process as discussed above, between the metal plug 230 and the S/D feature trench, i.e. between the metal plug 230 and a bottom surface of the S/D feature trench (a top surface of the lower portion 260L of the S/D feature), between the metal plug 230 and the termination ends of the top semiconductor layers wrapped by the upper portion 260U of the S/D feature, and between the metal plug 230 and the sidewalls of the upper portion 260U of the S/D feature facing away from the gate structures. In some embodiments, since the S/D contact directly contacts at least the top semiconductor layer, the S/D parasitic resistance may be reduced, the on-current may be increased, and thereby, the performance of the semiconductor device may be improved. With the silicide structures 240 formed between the metal plug 230 and the semiconductor layers 210A, the S/D parasitic resistance can be further reduced.

Although not intended to be limiting, one or more embodiments of the present disclosure provide many benefits to an integrated circuit and a formation process thereof. For example, embodiments of the present disclosure provide semiconductor devices having S/D contact directly contacting the semiconductor layer(s) of the nanostructures. The direct contact between the S/D contact and the semiconductor layer(s) may reduce the S/D parasitic resistance, provide better on-current performance, thereby to mitigate the issues caused by the poor quality of the S/D features of the conventional GAA device and to improve the performance of the semiconductor device. In some embodiments, the processing step of epitaxially growing of the S/D features can be skipped, thereby to simplify the fabrication process and reduce the fabrication cost.

The present disclosure provides for many different embodiments. GAA IC device having S/D contact structures directly contact the semiconductor layers and methods of fabrication thereof are disclosed herein. An exemplary semiconductor device comprises a first nanostructure and a second nanostructure formed on a substrate, wherein each of the first nanostructure and the second nanostructure includes a plurality of semiconductor layers and each of the first nanostructure and the second nanostructure includes a channel region and a source/drain (S/D) region. The exemplary semiconductor device further comprises a first gate structure wrapping the plurality of semiconductor layers of the first nanostructure and a second gate structure wrapping the plurality of semiconductor layers of the second nanostructure, and a S/D contact that contacts at least one of the plurality of semiconductor layers of the first nanostructure and at least one of the plurality of semiconductor layers of the second nanostructure.

In some embodiments, the S/D contact includes a metal plug and a silicide structure, the silicide structure is formed between the metal plug and the at least one of the plurality of semiconductor layers of the first and the second nano structures.

In some embodiments, the S/D contact contacts a termination end of the at least one of the plurality of semiconductor layers of the first nanostructure in the S/D region of the first nanostructure and the S/D contact contacts a termination end of the at least one of the plurality of semiconductor layers of the second nanostructure in the S/D region of the second nanostructure. In some further embodiments, the S/D contact includes a metal plug and a silicide structure, the silicide structure is formed between the metal plug and the termination end of the at least one of the plurality of semiconductor layers of the first nanostructure and between the metal plug and the termination end of the at least one of the plurality of semiconductor layers of the second nanostructure.

In some embodiments, each of the first and the second gate structures comprises a gate electrode and spacers disposed along sidewalls of the gate electrode; and a first portion of the plurality of semiconductor layers of the first and the second nanostructures is wrapped by the gate electrodes of the first and the second gate structures, a second portion of the plurality of semiconductor layers of the first and the second nanostructures is wrapped by the spacers of the first and the second gate structures, and a third portion of the plurality of semiconductor layers of the first and the second nanostructures interfaces the S/D contact. In some further embodiments, the S/D contact includes a metal plug and a silicide structure, the silicide structure is formed between the metal plug and the third portion of the plurality of semiconductor layers of the first and the second nanostructures interfacing the S/D contact.

In some embodiments, a first one of the plurality of semiconductor layers of the first nanostructure is contiguous with a first one of the plurality of semiconductor layers of the second nanostructure to form a contiguous semiconductor layer and the S/D contact wraps the contiguous semiconductor layer. In some further embodiments, the S/D contact includes a metal plug and a silicide structure, the silicide structure wraps the contiguous semiconductor layer and the metal plug wraps the silicide structure.

In some embodiments, the exemplary semiconductor device further comprises an S/D feature epitaxially grown between the first gate structure and the second gate structure, wherein a top surface of the S/D feature is below bottom surfaces of a top layer of the plurality of semiconductor layers of the first and the second nanostructures, the S/D contact contacts the top surface of the S/D feature and termination ends of the top layer of the plurality of semiconductor layers of the first and the second nanostructures, and the S/D feature contacts termination ends of the bottom layer of the plurality of semiconductor layers of the first and the second nanostructures. In some further embodiments, the S/D contact includes a metal plug and a silicide structure, a first portion of the silicide structure is formed between the metal plug and the termination ends of the top layer of the plurality of semiconductor layers of the first and the second nanostructures and a second portion of the silicide structure is formed between a bottom surface of the metal plug and the top surface of the S/D feature.

In some embodiments, the exemplary semiconductor device further comprises an S/D feature epitaxially grown between the first gate structure and the second gate structure, wherein the S/D feature includes an upper portion and a lower portion, a top layer of the plurality of semiconductor layers of the first and second nanostructures extending through the upper portion of the S/D feature and contacting the S/D contact at a terminal end of the top layer of the plurality of semiconductor layers, and the lower portion of the S/D feature contacting a bottom surface of the S/D contact. In some further embodiments, the S/D contact includes a metal plug and a silicide structure, the silicide structure being formed between the terminal end of the top layer of the plurality of semiconductor layers and the metal plug, between sidewalls of the upper portion of the S/D feature and the metal plug, and between a top surface of the lower portion of the S/D feature and the metal plug.

Another exemplary semiconductor device comprises a first nanostructure and a second nanostructure formed on a substrate, wherein each of the first nano structure and the second nanostructure includes a plurality of semiconductor layers and each of the first nanostructure and the second nanostructure includes a channel region and a source/drain (S/D) region. The another exemplary semiconductor device further comprises a first gate structure including a first gate electrode and first spacers disposed along sidewalls of the first gate electrode and a second gate structure including a second gate electrode and second spacers disposed along sidewalls of the second gate electrode, wherein the first gate electrode wraps the plurality of semiconductor layers in the channel region of the first nanostructure and the first spacers wraps at least a portion of the plurality of semiconductor layers in the S/D region of the first nanostructure, the second gate electrode wraps the plurality of semiconductor layers in the channel region of the second nanostructure and the second spacers wraps at least a portion of the plurality of semiconductor layers in the S/D region of the second nanostructure, and a S/D contact disposed between the first gate structure and the second gate structure and extending below a top layer of the plurality of semiconductor layers of the first and the second nanostructures.

In some embodiments, a first doping concentration of a first dopant type in the plurality of semiconductor layers in the S/D regions of the first and second nanostructures wrapped by the first and the second spacers is greater than a second doping concentration of the first dopant type in the plurality of semiconductor layers in the channel regions of the first and second nanostructures wrapped by the first and the second gate electrodes. In some further embodiments, the plurality of semiconductor layers in the S/D regions of the first and second nanostructures wrapped by the first and the second spacers includes a first type dopant and the plurality of semiconductor layers in the channel regions of the first and second nanostructures wrapped by the first and the second gate electrodes includes a second type dopant that is opposite the first type dopant.

An exemplary method comprises forming a nanostructure on a substrate, wherein the nanostructure includes at least a first semiconductor layer and a second semiconductor layer comprising different semiconductor materials, the nanostructure includes a channel region and a source/drain (S/D) region; forming a dummy gate structure over the nanostructure, the dummy gate structure comprises a dummy gate stack over the channel region of the nanostructure and gate spacers disposed along sidewalls of the dummy gate stack; removing portions of the second semiconductor layer in the S/D region of the nanostructure; forming inner spacers along sidewalls of remained portions of the second semiconductor layer, wherein a portion of the first semiconductor layer is disposed between the inner spacer and the gate spacer and exposed in the S/D region of the nanostructure; replacing the dummy gate stack with a metal gate stack, wherein the metal gate stack wraps the first semiconductor layer in the channel region of the nanostructure; and forming a S/D contact physically contacting the portion of the first semiconductor layer exposed in the S/D region of the nanostructure.

In some embodiments, forming a S/D contact further comprises forming a metal plug to enclose the portion of the first semiconductor layer exposed in the S/D region of the nanostructure; and forming a silicide structure between the metal plug and the portion of the first semiconductor layer exposed in the S/D region of the nanostructure. In some further embodiments, forming the silicide structure comprises performing an annealing process to the metal plug to form the silicide structure between the metal plug and the portion of the first semiconductor layer exposed in the S/D region of the nanostructure.

In some embodiments, the method further comprises epitaxially growing a S/D feature in the S/D region of the nanostructure, wherein the S/D feature physically connects a termination end of a bottom layer of the first semiconductor layers.

In some embodiments, the method further comprises performing a doping process to the portion of the first semiconductor layer exposed in the S/D region of the nanostructure, so that a doping concentration of a portion of the first semiconductor layer disposed between the gate spacer and the inner spacer is greater than a doping concentration of a portion of the first semiconductor layer wrapped by the metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first nanostructure and a second nanostructure over a substrate, wherein each of the first nanostructure and the second nanostructure includes a plurality of semiconductor layers and each of the first nanostructure and the second nanostructure includes a channel region and a source/drain (S/D) region;
    a first gate structure wrapping the plurality of semiconductor layers of the first nanostructure and a second gate structure wrapping the plurality of semiconductor layers of the second nanostructure;
    a S/D contact that contacts at least one of the plurality of semiconductor layers of the first nanostructure and at least one of the plurality of semiconductor layers of the second nanostructure;
    a S/D epitaxial feature between the first gate structure and the second gate structure, wherein a top surface of the S/D epitaxial feature is below a bottom surface of a top layer of the plurality of semiconductor layers of the first nanostructure and a bottom surface of a top layer of the plurality of semiconductor layers of the second nanostructure;
    wherein the S/D contact contacts the top surface of the S/D epitaxial feature, the S/D contact contacts a termination end of the top layer of the plurality of semiconductor layers of the first nanostructure, and the S/D contact contacts a termination end of the top layer of the plurality of semiconductor layers of the second nanostructure; and
    wherein the S/D epitaxial feature contacts a termination end of a bottom layer of the plurality of semiconductor layers of the first nanostructure and the S/D epitaxial feature contacts a bottom layer of the plurality of semiconductor layers of the second nanostructure.

2. The semiconductor device of claim 1, wherein the S/D contact includes a metal plug and a silicide structure, the silicide structure is between the metal plug and a sidewall of the termination end of the top layer of the plurality of semiconductor layers of the first nanostructure, and the silicide structure is between the metal plug and a sidewall of the termination end of the top layer of the plurality of semiconductor layers of the second nanostructure.

3. The semiconductor device of claim 2, wherein the silicide structure is further between the S/D epitaxial feature and the metal plug.

4. The semiconductor device of claim 2, wherein the silicide structure wraps the termination end of the top layer of the plurality of semiconductor layers of the first nanostructure and wraps the termination end of the top layer of the plurality of semiconductor layers of the second nano structure.

5. The semiconductor device of claim 1, wherein:
the first gate structure includes a first gate electrode and first spacers disposed along sidewalls of the first gate electrode and the second gate structure includes a second gate electrode and second spacers disposed along sidewalls of the second gate electrode;
a first portion of the plurality of semiconductor layers of the first nanostructure is wrapped by the first gate electrode of the first gate structure and a first portion of the plurality of semiconductor layers of the second nanostructure is wrapped by the second gate electrode of the second gate structure;
a second portion of the plurality of semiconductor layers of the first nanostructure is wrapped by the first spacers of the first gate structure and a second portion of the plurality of semiconductor layers of the second nanostructure is wrapped by the second spacers of the second gate structure; and
a third portion of the plurality of semiconductor layers of the first nanostructure and a third portion of the plurality of semiconductor layers of the second nanostructure interfaces the S/D contact.

6. The semiconductor device of claim 1 wherein:
the S/D contact includes a metal plug and a silicide structure;
the silicide structure is between the metal plug and a top surface of the termination end of the top layer of the plurality of semiconductor layers of the first nanostructure and the silicide structure is between the metal plug and a top surface of the termination end of the top layer of the plurality of semiconductor layers of the second nanostructure; and
the silicide structure is between the metal plug and a bottom surface of the termination end of the top layer of the plurality of semiconductor layers of the first nanostructure and the silicide structure is between the metal plug and a bottom surface of the termination end of the top layer of the plurality of semiconductor layers of the second nanostructure.

7. The semiconductor device of claim 1, wherein a first one of the plurality of semiconductor layers of the first nanostructure is contiguous with a first one of the plurality of semiconductor layers of the second nanostructure to form a contiguous semiconductor layer and the S/D contact wraps the contiguous semiconductor layer.

8. The semiconductor device of claim 7, wherein the S/D contact includes a metal plug and a silicide structure, the silicide structure wraps the contiguous semiconductor layer and the metal plug wraps the silicide structure.

9. The semiconductor device of claim 1, wherein the S/D contact includes a metal plug and a silicide structure, a first portion of the silicide structure is between the metal plug and the termination end of the top layer of the plurality of semiconductor layers of the first nanostructure, a second portion of the silicide structure is between the metal plug and the top layer of the plurality of semiconductor layers of the second nanostructure, and a third portion of the silicide structure is between the metal plug and the top surface of the S/D epitaxial feature.

10. The semiconductor device of claim 1,
wherein the S/D epitaxial feature includes an upper portion and a lower portion, the top layer of the plurality of semiconductor layers of the first nanostructure and the top layer of the plurality of semiconductor layers of the second nanostructure extend through the upper portion of the S/D epitaxial feature to the S/D contact, and the lower portion of the S/D feature contacts a bottom surface of the S/D contact.

11. The semiconductor device claim 10, wherein the S/D contact includes a metal plug and a silicide structure, the silicide structure is between the metal plug and the termination end of the top layer of the plurality of semiconductor layers of the first nanostructure, the silicide structure is between the metal plug and the termination end of the top layer of the plurality of semiconductor layers of the second nanostructure, the silicide structure is between sidewalls of the upper portion of the S/D epitaxial feature and the metal plug, and the silicide structure is between a top surface of the lower portion of the S/D epitaxial feature and the metal plug.

12. The semiconductor device of claim 11, wherein the silicide structure wraps a bottom portion of the metal plug.

13. A semiconductor device comprising:
a first channel structure and a second channel structure disposed over a substrate, wherein the first channel structure includes first semiconductor layers having a first channel region and a first source/drain (S/D) region and the second channel structure includes second semiconductor layers having a second channel region and a second S/D region, wherein the first semiconductor layers and the second semiconductor layers extend along a first lengthwise direction;
a first gate structure including a first gate electrode and first gate spacers disposed along sidewalls of the first gate electrode and a second gate structure including a second gate electrode and second gate spacers disposed along sidewalls of the second gate electrode, wherein the first gate structure and the second gate structure extend along a second lengthwise direction different than the first lengthwise direction, the first gate electrode wraps the first semiconductor layers in the first channel region of the first channel structure, the first gate spacers contact a top surface of a top layer of the first semiconductor layers in the first S/D region of the first channel structure, the second gate electrode wraps the second semiconductor layers in the second channel region of the second channel structure, and the second gate spacers contact a top surface of a top layer of the second semiconductor layers in the second S/D region of the second channel structure;
a metal S/D contact disposed between the first gate structure and the second gate structure, wherein the metal S/D contact contacts and extends below the top layer of the first semiconductor layers of the first channel structure and the top layer of the second semiconductor layers of the second channel structure; and
a first dielectric spacer between the first gate electrode and the metal S/D contact and a second dielectric spacer between the second gate electrode and the metal S/D contact, wherein the first dielectric spacer contacts a bottom surface of the top layer of the first semiconductor layers in the first S/D region of the first channel structure, the second dielectric spacer contacts a bottom surface of the top layer of the second semiconductor layers in the second S/D region of the second channel structure, a maximum thickness of the first dielectric spacer along the first lengthwise direction is less than or equal to a maximum thickness of the first gate spacers along the first lengthwise direction, and a maximum thickness of the second dielectric spacer along the first lengthwise direction is less than or equal to a maximum thickness of the second gate spacers along the first lengthwise direction.

14. The semiconductor device of claim 13, wherein a first doping concentration of a first dopant type in the first semiconductor layers in the first S/D region of the first channel structure and in the second semiconductor layers in the second S/D region of the second channel structure is greater than a second doping concentration of the first dopant type in the first semiconductor layers in the first channel region of the first channel structure and the second semiconductor layers in the second channel region of the second channel structure.

15. The semiconductor device of claim 13, wherein:
the first semiconductor layers in the first S/D region of the first channel structure and the second semiconductor layers in the second S/D region of the second channel structure include a first type dopant; and
the first semiconductor layers in the first channel region of the first channel structure and the second semiconductor layers in the second channel region of the second channel structure include a second type dopant that is opposite the first type dopant.

16. A semiconductor device, comprising:
a semiconductor layer disposed over a substrate;
a metal gate stack that wraps a first portion of the semiconductor layer, wherein the semiconductor layer extends lengthwise along a first direction, the metal gate stack extends lengthwise along a second direction that is different than the first direction, and a length of the semiconductor layer is between a first sidewall and a second sidewall;
a dielectric layer that wraps second portions of the semiconductor layer, wherein the first portion of the semiconductor layer is between the second portions of the semiconductor layer;
a first metal source/drain contact and a second metal source/drain contact disposed over the substrate, wherein the first metal source/drain contact contacts the first sidewall of the semiconductor layer and the second metal source/drain contact contacts the second sidewall of the semiconductor layer, wherein the metal gate stack is disposed between the first metal source/drain contact and the second metal source/drain contact; and
wherein the dielectric layer extends along the first direction a first distance from the metal gate stack, the semiconductor layer extends along the first direction a second distance from the metal gate stack, and the second distance is greater than or equal to the first distance.

17. The semiconductor device of claim 16, wherein the second distance is greater than the first distance.

18. The semiconductor device of claim 16, wherein the first portion of the semiconductor layer has a first dopant concentration and the second portions of the semiconductor layer have a second dopant concentration, wherein the second dopant concentration is greater than the first dopant concentration.

19. The semiconductor device of claim 16, wherein the first metal source/drain contact includes a first metal plug and a first silicide structure and the second metal source/drain contact includes a second metal plug and a second silicide structure, wherein the first silicide structure is disposed between the first metal plug and the first sidewall of the semiconductor layer and the second silicide structure is disposed between the second metal plug and the second sidewall of the semiconductor layer.

20. The semiconductor device of claim 16, wherein the dielectric layer is free of metal.

* * * * *